US012628457B2

(12) United States Patent
Jeong et al.

(10) Patent No.: US 12,628,457 B2
(45) Date of Patent: May 12, 2026

(54) IMAGE SENSORS AND METHODS OF MANUFACTURING THE SAME

(71) Applicant: Samsung Electronics Co., Ltd., Suwon-si (KR)

(72) Inventors: Hoemin Jeong, Suwon-si (KR); Seungjoo Nah, Suwon-si (KR); Heegeun Jeong, Suwon-si (KR); Soongeul Choi, Suwon-si (KR); Dongmin Han, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 465 days.

(21) Appl. No.: 18/342,376

(22) Filed: Jun. 27, 2023

(65) Prior Publication Data

US 2023/0420476 A1 Dec. 28, 2023

(30) Foreign Application Priority Data

Jun. 28, 2022 (KR) ........................ 10-2022-0078721

(51) Int. Cl.
H10F 39/00 (2025.01)
(52) U.S. Cl.
CPC ......... H10F 39/811 (2025.01); H10F 39/024 (2025.01); H10F 39/8053 (2025.01); H10F 39/8063 (2025.01)
(58) Field of Classification Search
None
See application file for complete search history.

(56) References Cited

U.S. PATENT DOCUMENTS

| | | | |
|---|---|---|---|
| 10,366,961 B1 * | 7/2019 | Borthakur | H10F 39/811 |
| 10,991,667 B2 * | 4/2021 | Huang | H10F 39/011 |
| 11,217,547 B2 * | 1/2022 | Chou | H10F 39/8053 |
| 2007/0152228 A1 | 7/2007 | Choi | |
| 2017/0040374 A1 * | 2/2017 | Oh | H01L 21/76898 |
| 2019/0148439 A1 * | 5/2019 | Shin | H10F 19/50 |
| | | | 257/443 |
| 2020/0350354 A1 * | 11/2020 | Park | H10F 39/026 |
| 2020/0395320 A1 | 12/2020 | Chang et al. | |
| 2021/0175286 A1 * | 6/2021 | Park | H10F 39/8053 |
| 2021/0384247 A1 | 12/2021 | Cheng et al. | |
| 2022/0013562 A1 | 1/2022 | Yang et al. | |
| 2022/0020804 A1 | 1/2022 | Kim et al. | |
| 2022/0045116 A1 | 2/2022 | Kim et al. | |

FOREIGN PATENT DOCUMENTS

| | | |
|---|---|---|
| KR | 10-0731133 B1 | 6/2007 |
| KR | 10-2008-0061442 A | 7/2008 |

* cited by examiner

*Primary Examiner* — Benjamin P Sandvik
(74) *Attorney, Agent, or Firm* — Harness, Dickey & Pierce, P.L.C.

(57) ABSTRACT

An image sensor includes a chip structure including first and second regions. The chip structure further includes a substrate having a first surface, a second surface, and a recess portion, a plurality of photoelectric conversion devices included in the substrate, at least one conductive layer on a sidewall and a bottom surface of the recess portion and on the horizontal insulating layer in the second region, a first passivation layer on a side surface of the conductive layer in the recess portion and the conductive layer on the horizontal insulating layer, and a second passivation layer on side surface of the first passivation layer in the recess portion.

20 Claims, 24 Drawing Sheets

1

IMAGE SENSORS AND METHODS OF MANUFACTURING THE SAME

CROSS-REFERENCE TO RELATED APPLICATION(S)

This U.S. non-provisional application claims the benefit of priority under 35 U.S.C. § 119 to Korean Patent Application No. 10-2022-0078721 filed on Jun. 28, 2022 in the Korean Intellectual Property Office, the disclosure of which is incorporated herein by reference in its entirety.

BACKGROUND

Various example embodiments of the inventive concepts relate to image sensors, systems including the image sensors, and/or methods of manufacturing the image sensors.

An image sensor is a semiconductor-based sensor receiving light to generate an electrical signal and may include a pixel array having a plurality of pixels, logic circuits for driving the pixel array and generating an image, and the like. Each of the plurality of pixels may include a photodiode, a pixel circuit converting a charge generated by the photodiode into an electrical signal, and the like.

SUMMARY

Various example embodiments provide an image sensor having improved productivity and/or reliability, a system including the image sensor, and/or methods of manufacturing the image sensor.

According to at least one example embodiment, an image sensor includes a chip structure including a first region and a second region, the chip structure further comprising, a substrate having a first surface, a second surface, and a recess portion, the second surface opposite the first surface, and the recess portion recessed from the second surface in the second region, a plurality of photoelectric conversion devices included in the substrate in the first region, at least one horizontal insulating layer on the second surface of the substrate, a plurality of color filters on the horizontal insulating layer in the first region, a grid pattern between the plurality of color filters on the horizontal insulating layer, a plurality of microlenses on the plurality of color filters, at least one conductive layer on a sidewall and a bottom surface of the recess portion and on the horizontal insulating layer in the second region, at least one conductive pad in contact with the conductive layer in the recess portion, a first passivation layer on a side surface of the conductive layer in the recess portion and the conductive layer on the horizontal insulating layer, and a second passivation layer on side surface of the first passivation layer in the recess portion.

According to at least one example embodiment, an image sensor includes a semiconductor substrate having a first surface, a second surface, and a recess portion, the second surface opposite the first surface, and the recess portion extending inward towards the semiconductor substrate from the second surface, a plurality of photoelectric conversion devices included in the semiconductor substrate, a conductive layer on a second surface of the semiconductor substrate, a conductive pad in contact with the conductive layer in the recess portion, a first passivation layer on a portion of the second surface of the semiconductor substrate, a side surface of the recess portion, a portion of a bottom surface of the recess portion, and a side surface of the conductive pad, and a second passivation layer on an upper surface of the first passivation layer and at least a portion of the first passivation layer in the recess portion, wherein the conductive layer extends between the first passivation layer and the second surface of the semiconductor substrate, between the first passivation layer and a side surface of the recess portion, between the first passivation and a portion of the bottom surface of the recess portion, and between a lower surface of the conductive pad and a portion of the bottom surface of the recess portion.

According to at least one example embodiment, an image sensor includes a chip structure, the chip structure including a first region and a second region, wherein the chip structure further comprises, an upper substrate having a first surface, a second surface, and a recess portion, the second surface opposite the first surface, and the recess portion recessed from the second surface in the second region, a plurality of photoelectric conversion devices included in the upper substrate in the first region, a horizontal insulating layer on the second surface of the upper substrate, a conductive layer on a side surface and a bottom surface of the recess portion and at least a portion of the horizontal insulating layer in the second region, at least one conductive pad in contact with the conductive layer in the recess portion, a first passivation layer on a side surface of the conductive layer in the recess portion and the conductive layer on the horizontal insulating layer, and a second passivation layer on a side surface of the first passivation layer in the recess portion, and the second passivation layer includes a first protrusion extended toward the first passivation layer from the side surface of the first passivation layer, the second passivation layer including a material having a step coverage higher than a step coverage of a material of the first passivation.

BRIEF DESCRIPTION OF DRAWINGS

The above and other aspects, features, and advantages of the example embodiments of the inventive concepts will be more clearly understood from the following detailed description, taken in conjunction with the accompanying drawings.

DETAILED DESCRIPTION

Figure 1:
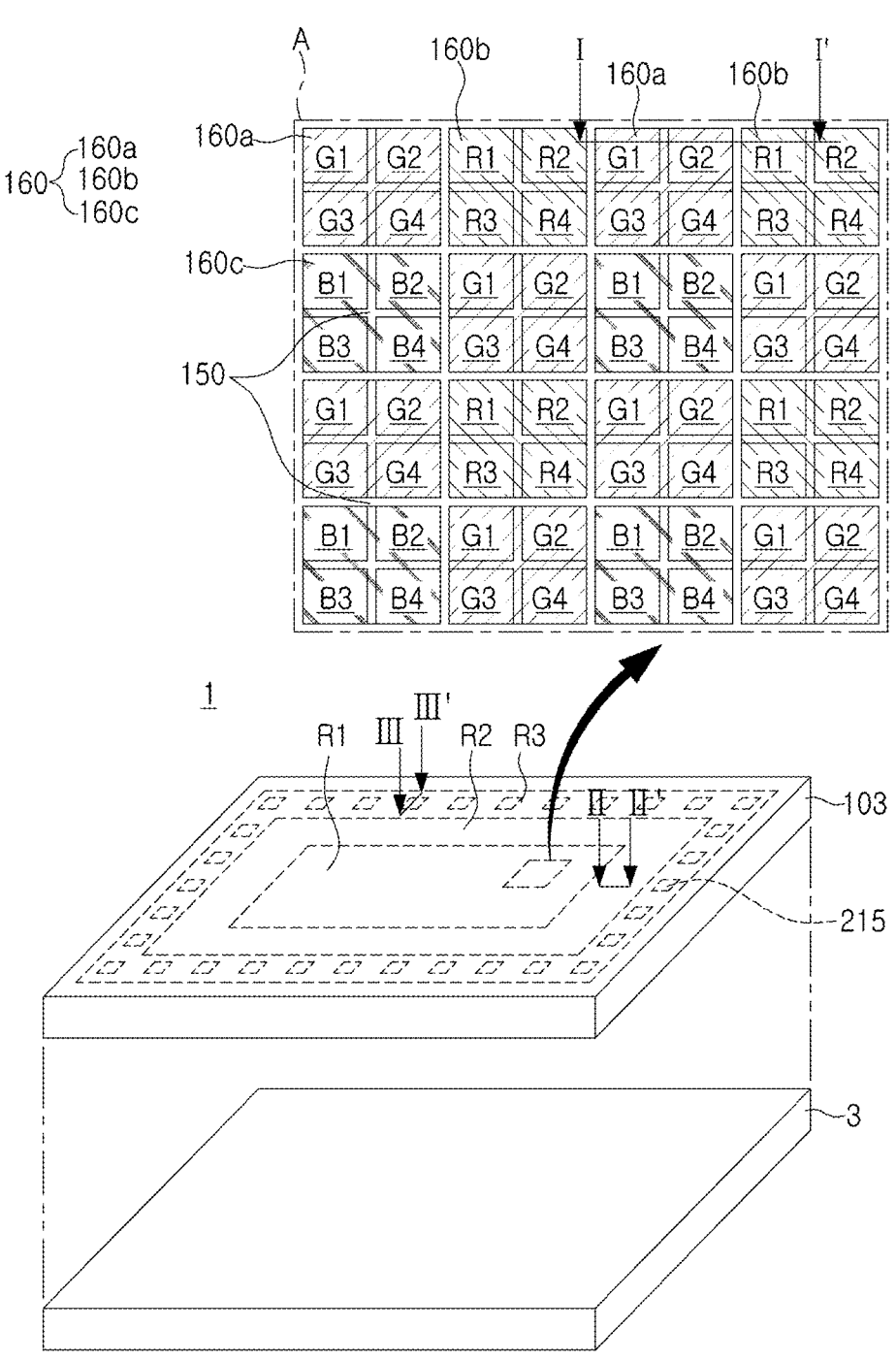
FIG. 1 is a schematic diagram illustrating an image sensor according to at least one example embodiment.

Hereinafter, various example embodiments of the inventive concepts will be described more fully hereinafter with reference to the accompanying drawings; however, they may be embodied in different forms and should not be construed as limited to the example embodiments set forth herein. Rather, these example embodiments are provided so that this disclosure will be thorough and complete, and will fully convey example implementations to those skilled in the art. In the drawing figures, the dimensions of layers and regions may be exaggerated for clarity of illustration. Like reference numerals refer to like elements throughout. The terms "upper," "upper portion," "upper surface," "lower," "lower portion," "lower surface," and "side surface" may be understood below on the basis of directions depicted in the drawings appended hereto, except in the case that they are indicated by the reference denotations and referenced separately.

FIG. 1 is a schematic diagram illustrating an image sensor according to at least one example embodiment. FIG. 1 is an exploded perspective view illustrating the image sensor, and a partially enlarged region indicated by "A" of FIG. 1 represents a planar shape of a portion of the image sensor illustrated in an exploded perspective view according to some example embodiments, but the example embodiments are not limited thereto.

Figure 2:
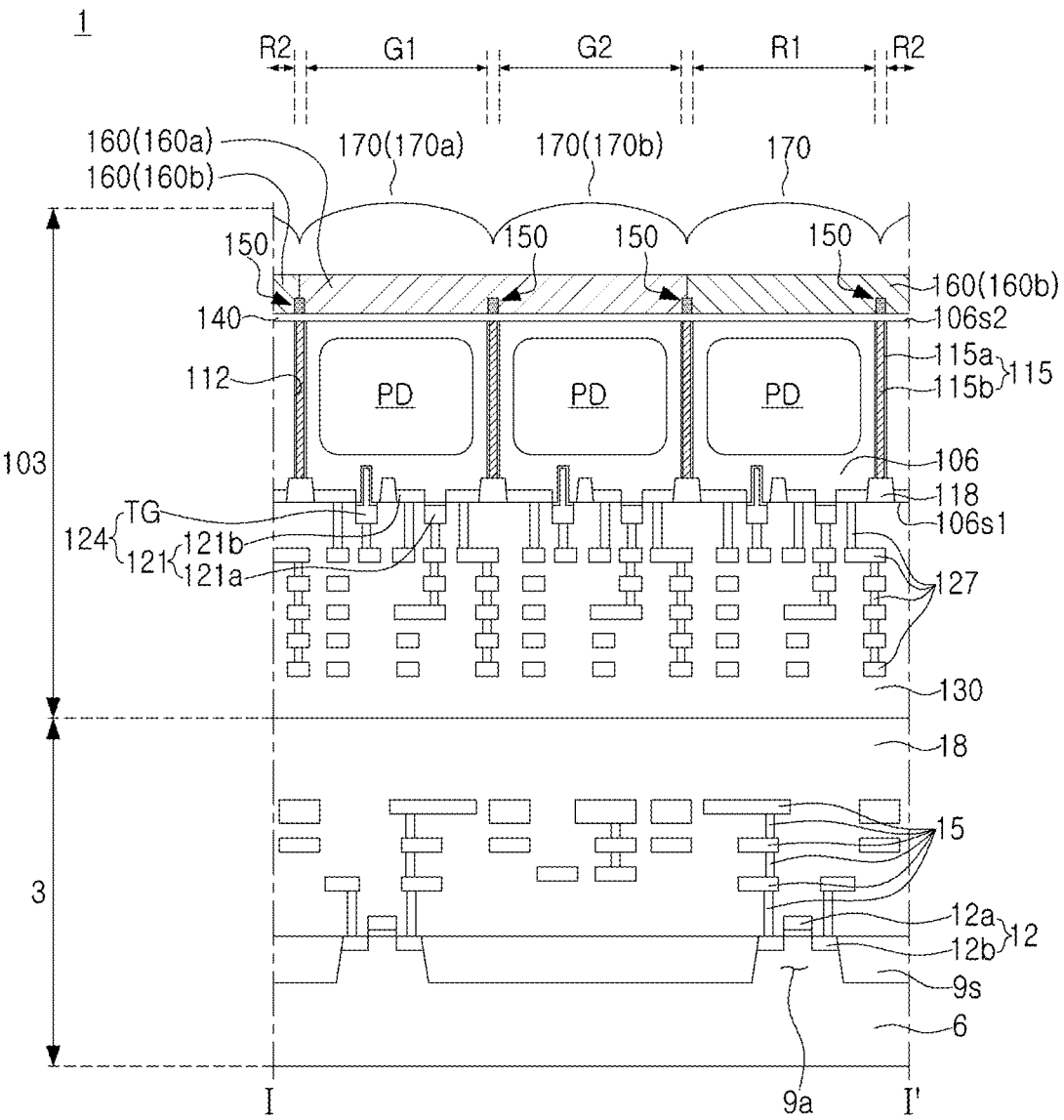
FIGS. 2 to 4 are schematic cross-sectional views illustrating an image sensor according to at least one example embodiment.
Figure 3:
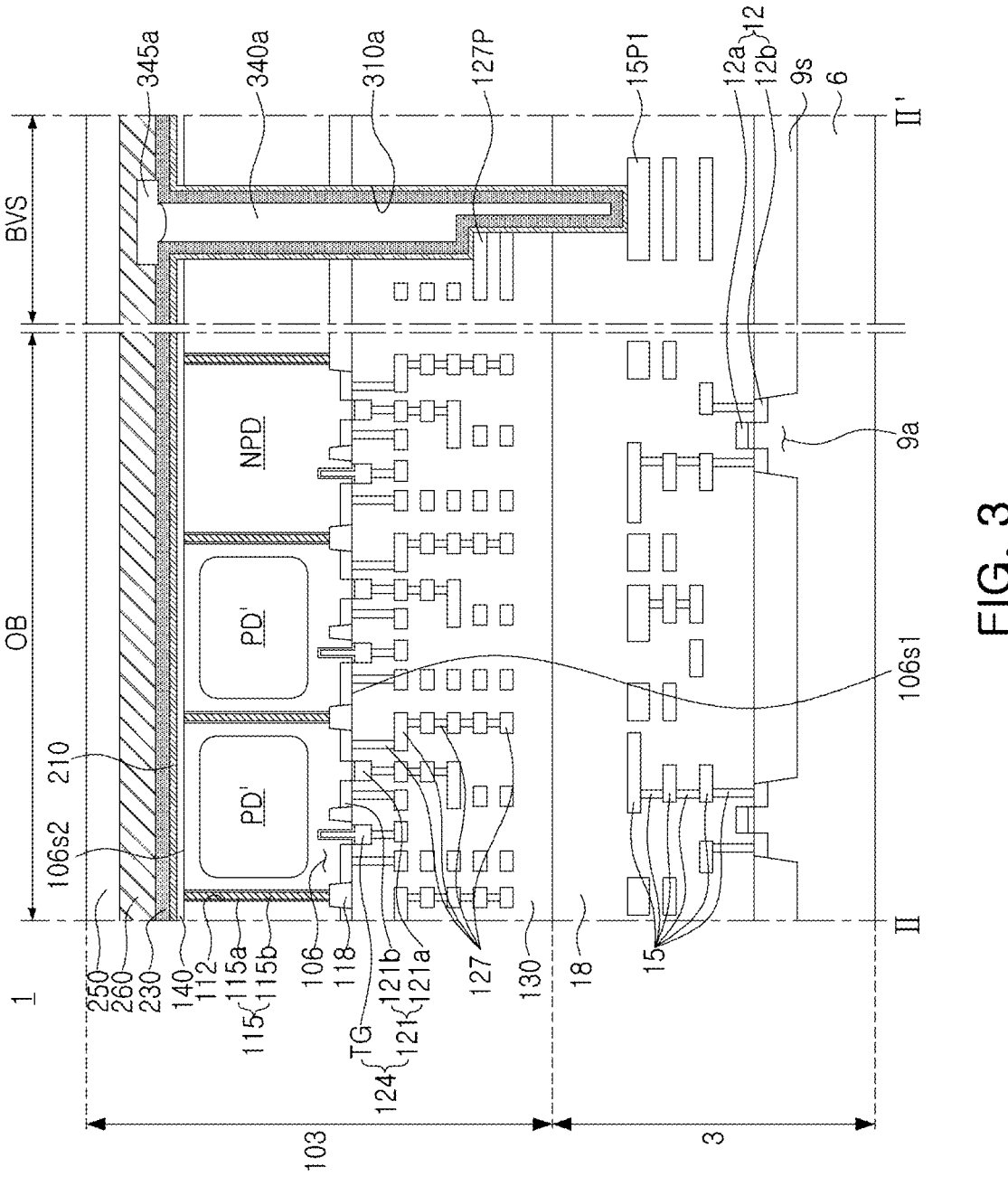
Figure 4:
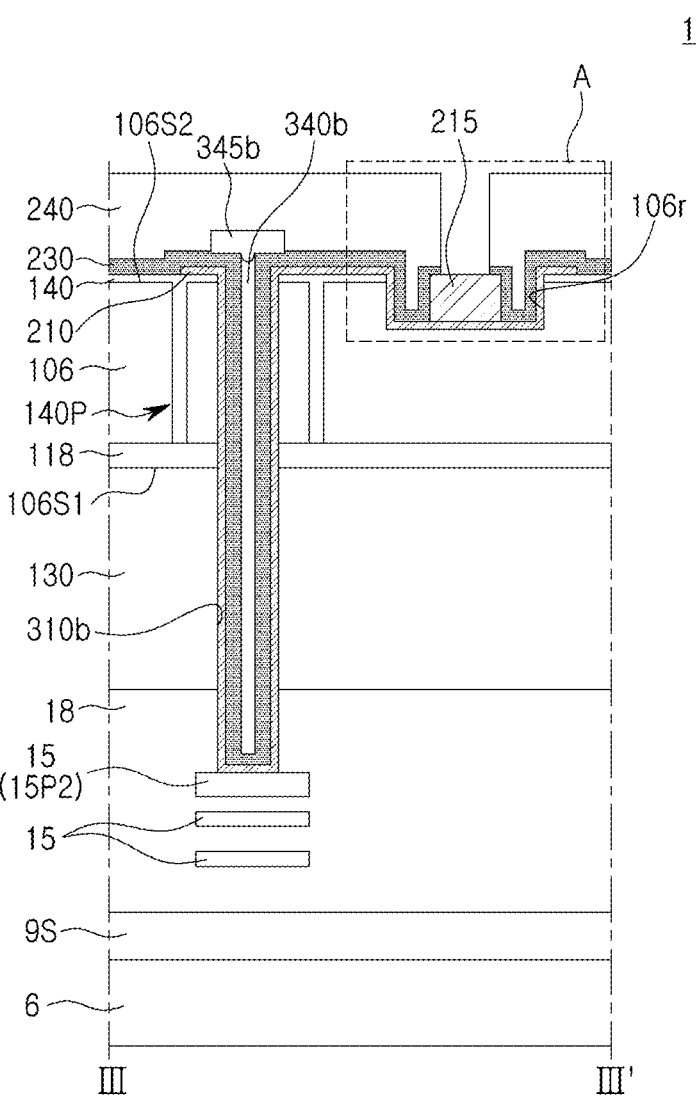

FIGS. 2 to 4 are schematic cross-sectional views illustrating an image sensor according to some example embodiments. FIG. 2 is a cross-sectional view taken along line I-I' of FIG. 1, FIG. 3 is a cross-sectional view taken along line II-II' of FIG. 1, and FIG. 4 is a cross-sectional view taken along line III-III' of FIG. 1, but the example embodiments are not limited thereto.

Figure 5:
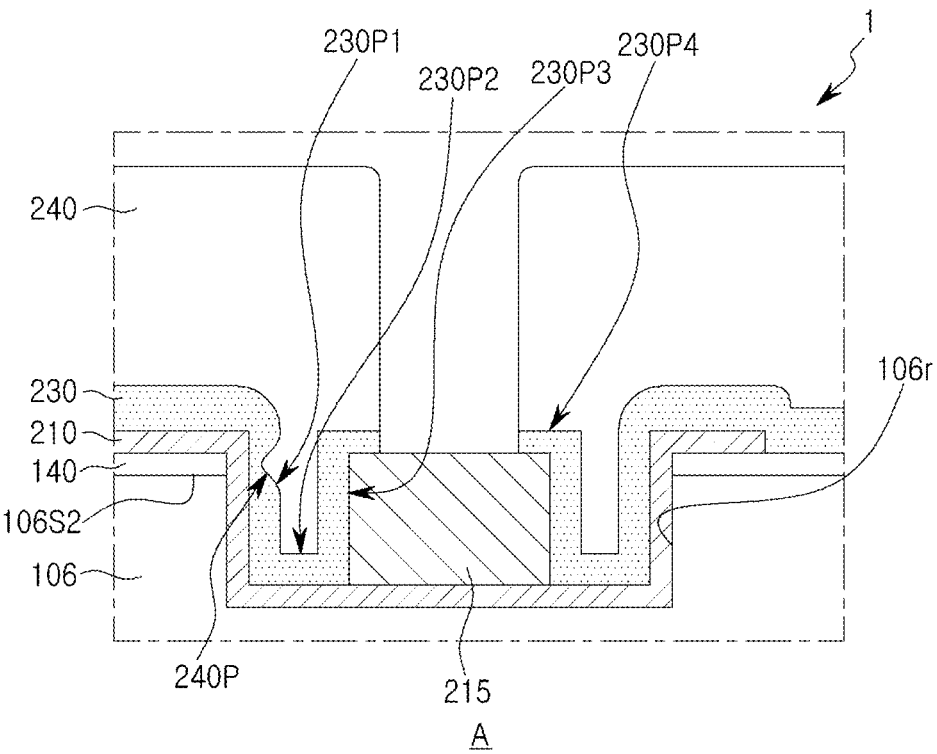
FIG. 5 is a partially enlarged view of a portion of an image sensor according to some example embodiments.

FIG. 5 is a partially enlarged view of a portion of an image sensor according to some example embodiments. FIG. 5 is a partially enlarged view of region "B" of FIG. 4, but the example embodiments are not limited thereto.

Referring to FIG. 1, an image sensor 1 may include a first chip structure 3, including a first substrate 6, and/or a second chip structure 103 including a second substrate 106, etc., but is not limited thereto, and for example, may include a greater or lesser number of constituent components. The second chip structure 103 may be on the first chip structure 3. In at least one example embodiment, the first chip structure 3 may be a logic chip (e.g., logic circuitry, processing circuitry, etc.), and the second chip structure 103 may be an image sensor chip including a plurality of pixel regions, e.g., pixel regions G1 to G4, R1 to R4, and B1 to B4, etc., but is not limited thereto. According to some example embodiments, the first chip structure 3 may be a stack chip structure including a logic chip and a memory chip, but is not limited thereto.

In at least one example embodiment, the second chip structure 103 may include a plurality of regions, e.g., a first region R1, a second region R2, and/or a third region R3, etc., but is not limited thereto, and for example, may include a greater or lesser number of regions. In at least one example embodiment, the third region R3 may be on at least one side of the first and second regions R1 and R2. For example, the third region R3 may be on opposite sides of a central region including the first region R1 and the second region R2, or may surround the central region, etc. The second region R2 may be on at least one side of the first region R1, etc. For example, the second region R2 may be on a first side of the first region R1, on opposite sides (e.g., two sides) of the first region R1, or surround the first region R1, etc. As another example, the second region R2 may surround the first region R1, and the third region R3 may surround the second region R2, etc.

The first region R1 may include at least one active pixel sensor array region, the second region R2 may include at least one optical black region (e.g., OB of FIG. 3) and at least one connection region (e.g., BVS of FIG. 3) between chips, and the third region R3 may include a pad region which includes input/output pads, but the example embodiments are not limited thereto. The third region R3 may be referred to as a pad region.

The first region R1 may be an active pixel sensor array region on which light is incident (e.g., light may be received and/or sensed on the active pixel sensor array region, etc.), the optical black region OB of the second region R2 may be a region on which light is not incident (e.g., no light is received on the OB region, etc.), and the connection region BVS of the second region R2 may be a region electrically connecting at least one interconnection structure of the first chip structure 3 and at least one interconnection structure of the second chip structure 103 to each other. The third region R3 may be a region including at least one conductive pad 215 electrically connected to the interconnection structure of the first chip structure 3, but is not limited thereto.

The second chip structure 103 may include a plurality of color filters 160, etc. The color filters 160 may include first color filters 160a of a first color, second color filters 160b of a second color, different from the first color, and/or third color filters 160c of a third color, different from the first and second colors, etc., but the example embodiments are not limited thereto, and for example, the plurality of color filters 160 may include a greater or lesser number of filter colors. For example, the first color may be a green color, the second color may be a red color, and/or the third color may be a blue color, etc., but the example embodiments are not limited thereto.

The first region R1, for example, the active pixel sensor array region, may include a plurality of pixel regions, e.g., G1 to G4 (e.g., a first pixel region group, etc.), R1 to R4 (e.g., a second pixel region group, etc.), and/or B1 to B4 (e.g., a third pixel region group, etc.), etc., but is not limited thereto. The plurality of pixel regions G1 to G4, R1 to R4, and B1 to B4 may be represented by reference numerals G1 to G4, R1 to R4, and B1 to B4 in the planar shape indicated by "A" of FIG. 1, but the example embodiments are not limited thereto, and for example, may have a greater or lesser number of pixel regions, different colored pixel regions, different number of pixels within each pixel region, etc. A single first pixel group G1 to G4, including a G1 pixel region, a G2 pixel region, a G3 pixel region, and/or a G4 pixel region, etc., adjacent to each other, may overlap one of the first color filters 160a, but is not limited thereto. A single second pixel group R1 to R4, including an R1 pixel region, an R2 pixel region, an R3 pixel region, and/or an R4 pixel region, etc., adjacent to each other, may overlap one of the second color filters 160b, but is not limited thereto. A single third pixel group B1 to B4, including a B1 pixel region, a B2 pixel region, a B3 pixel region, and/or a B4 pixel region, etc., adjacent to each other, may overlap one of the third color filters 160c, but is not limited thereto.

When portion "A" of FIG. 1 is viewed in plan view, the second chip structure 103 may further include a grid pattern 150 between the respective pixel regions G1 to G4, R1 to R4, and/or B1 to B4, etc. The grid pattern 150 may be in the form of a grid including horizontal portions and vertical portions, intersecting each other in a perpendicular direction.

Referring to FIGS. 2 to 5, the first chip structure 3 of the image sensor 1 according to some example embodiments may include a first substrate 6, an isolation layer 9s defining an active region 9a on the first substrate 6, a first circuit device 12 and/or a first interconnection structure 15 on the first substrate 6, and/or a first insulating layer 18 covering the first circuit device 12 and/or the first interconnection structure 15 on the first substrate 6, etc., but the example embodiments are not limited thereto. A first insulating layer 18 covering the interconnection structure 15 may be included. The first substrate 6 may be a semiconductor substrate. For example, the first substrate 6 may be a substrate formed of a semiconductor material, for example, a single-crystalline silicon substrate, etc., but is not limited thereto. The circuit device 12 may include semiconductor devices, such as a transistor having a gate 12a and a source/drain 12b, but is not limited thereto.

The second chip structure 103 of the image sensor 1 may include a second substrate 106 having a first surface 106s1 and a second surface 106s2 opposite to each other, an isolation layer 118 on the first surface 106s1 of the second substrate 106 to define an active region, a second circuit device 124 and a second interconnection structure 127 between the first surface 106s1 of the second substrate 106 and the first chip structure 3, and/or a second insulating layer 130 covering the second circuit device 124 and the second interconnection structure 127 between the first surface 106s1 of the second substrate 106 and the first chip structure 3, but the example embodiments are not limited thereto. The first surface 106s1 of the second chip structure 103 may be a surface facing the first chip structure 3, but is not limited thereto.

In at least one example embodiment, the second chip structure 103 may further include a horizontal insulating layer 140 on the second surface 106s2, a grid pattern 150 on the horizontal insulating layer 140, a plurality of color filters 160 covering the horizontal insulating layer 140 and the grid pattern 150, a plurality of microlenses 170, a conductive layer 210 on the horizontal insulating layer 140, a conductive pad 215 contacting the conductive layer 210, and/or first and second passivation layers 230 and 240 covering the conductive layer 210, etc., but is not limited thereto.

The second substrate 106 may be a semiconductor substrate. For example, the second substrate 106 may be a substrate formed of a semiconductor material, for example, a single-crystalline silicon substrate, but is not limited thereto. A first surface 106s1 of the second substrate 106 may contact the second insulating layer 130.

Photoelectric conversion devices PD may be included in the second substrate 106. The photoelectric conversion devices PD may generate and accumulate electric charges corresponding to and/or based on received incident light. For example, the photoelectric conversion devices PD may include a photodiode, a phototransistor, a photogate, a pinned photodiode (PPD), and/or combinations thereof. In at least one example embodiment, the photoelectric conversion devices PD may be included in the first region R1, but are not limited thereto.

Referring to FIG. 1 together, each of the pixel regions G1 to G4, R1 to R4, and B1 to B4 may include a single photoelectric conversion device PD, but the example embodiments are not limited thereto. The photoelectric conversion devices PD, included in each of the pixel regions G1 to G4, R1 to R4, and B1 to B4, may be spaced apart from each other.

In at least one example embodiment, a first reference region PD', formed the same as the photoelectric conversion devices PD, and a second reference region NPD, in which the photoelectric conversion device PD is not formed, may be defined in the optical black region OB of the second region R2, but the example embodiments are not limited thereto. The second reference region NPD may be a comparison region in which the photoelectric conversion devices PD are not included, or a comparison region in which photodiodes of the photoelectric conversion devices PD are not included. In other words, the optical black region OB does not have semiconductor devices capable of generating and accumulating electric charges corresponding to and/or based on received incident light.

In at least one example embodiment, the second chip structure 103 may further include at least one separation structure 115. The separation structure 115 may separate and/or surround each of the photoelectric conversion devices PD, but is not limited thereto. For example, the separation structure 115 may be in a through-opening 112 penetrating through the second substrate 106, but is not limited thereto. The separation structure 115 may penetrate through the second substrate 106. The through-opening 112 may be connected to the isolation layer 118, but is not limited thereto. Accordingly, the separation structure 115 may be connected to the isolation layer 118.

The isolation layer 118 may be on the first surface 106s1 of the second substrate 106 to define an active region. The isolation layer 118 may be formed of an insulating material, such as a silicon oxide, etc.

In at least one example embodiment, the separation structure 115 may include a separation pattern 115b and/or a separation insulating layer 115a covering a side surface of the separation pattern 115b. For example, the separation insulating layer 115a may include a silicon oxide, and the separation pattern 115b may include polysilicon, but the example embodiments are not limited thereto, and for example, the separation insulating layer 115a and/or the separation pattern 115b may be made of other materials, etc.

In the second region R2, the first and second reference regions PD' and NPD may be in the second substrate 106 and may be separated from each other by the separation structure 115. For example, the separation structure 115 may surround a side surface of each of the first reference region PD' and the second reference region NPD in the second region R2, etc.

The second circuit device 124 may include at least one transmission gate TG and/or a plurality of active devices 121, etc., but is not limited thereto. The active devices 121 may be a plurality of transistors having a gate 121a and a source/drain 121b, but are not limited thereto. The transmission gate TG may transmit charges from an adjacent photoelectric conversion device PD to an adjacent floating diffusion region, and the active devices 121 may be, e.g., at least one of a source follower transistor, a reset transistor, and/or a select transistor, etc. The transmission gate TG may be a vertical transmission gate including a portion extending inwardly of the second substrate 106 from the first surface 106s1 of the second substrate 106, but is not limited thereto.

The second interconnection structure 127 may include multilayer interconnections on different height levels, and vias electrically connecting the multilayer interconnections to each other and/or electrically connecting the multilayer interconnections to the second circuit device 124, etc.

The second insulating layer 130 and the first insulating layer 18 may be bonded to each other while contacting each other. Each of the first and second insulating layers 18 and 130 may be formed to have multilayer structures including different types of insulating layers. For example, the second insulating layer 130 may be formed to have a multilayer structure including at least two types of a silicon oxide layer, a low-κ dielectric layer, and/or a silicon nitride layer, etc., but is not limited thereto.

The horizontal insulating layer 140 may cover the second substrate 106 on the second surface 106s of the second substrate 106. The horizontal insulating layer 140 may cover the separation structure 115.

In at least one example embodiment, the horizontal insulating layer 140 may include a plurality of layers stacked sequentially, but is not limited thereto. The horizontal insulating layer 140 may include an antireflection film for decreasing and/or preventing reflection of light that may occur due to a drastic change in refractive index on the second surface 106s2 of the second substrate 106 that may be formed of, for example, silicon, etc. For example, the horizontal insulating layer 140 may include at least two layers, among an aluminum oxide layer, a hafnium oxide layer, a silicon oxynitride layer, a silicon oxide layer, and/or a silicon nitride layer, etc. For example, the horizontal insulating layer 140 may include a plurality of layers, e.g., first to fourth layers, etc., stacked sequentially, but is not limited thereto. The first layer may be an aluminum oxide layer, each of the second and fourth layers may be a hafnium oxide layer, and/or the third layer may be a silicon oxide layer, etc.

The horizontal insulating layer 140 may extend from the first region R1 to the second region R2 and/or the third region R3, etc. The horizontal insulating layer 140 may be formed to have the same and/or substantially the same thickness (e.g., within +/−15% of the same thickness) and to have upper surfaces of the same and/or substantially same level (e.g., within +/−15% of the same height) in the first to third regions R1, R2, and/or R3, etc., but the example embodiments are not limited thereto.

The grid pattern 150 may be on the horizontal insulating layer 140 in the first region R1. The grid pattern 150 may be between the plurality of pixel regions G1 to G4, R1 to R4, and/or B1 to B4, etc., as described with reference to FIG. 1, but the example embodiments are not limited thereto. The grid pattern 150 may include an insulating material, for example, a low refractive index (LRI) material, for example, an oxide and/or a nitride including Si, Al, etc., or a combination thereof. Also, the grid pattern 150 may include, e.g., a silicon oxide, etc., having a porous structure and/or silica nanoparticles having a network structure, etc.

In some example embodiments, the grid pattern 150 may have a double-layer structure including a first layer, formed of a conductive material, and a second layer on the first layer and having an insulating material, and/or may be in a combination of the double-layer structure and a single-layer structure, etc. However, the number of layers and materials of the grid pattern 150 are not limited thereto and may vary according to the example embodiments.

The color filters 160 may be on the horizontal insulating layer 140 to cover the horizontal insulating layer 140 and/or the grid pattern 150, etc. The color filters 160 may pass light having a desired and/or specific wavelength to reach the photoelectric conversion devices PD, and may filter and/or block light not having the desired and/or specific wavelength from reaching the photoelectric conversion devices PD, etc. Each of the color filters 160 may vertically overlap each of the pixel regions G1 to G4, R1 to R4, and/or B1 to B4, etc. The color filters 160 may be formed of, for example, a material in which a resin and a pigment, including a metal or a metal oxide, are mixed, but are not limited thereto. A thickness of each of the color filters 160 may be higher than a thickness of the grid pattern 150, but are not limited thereto. Accordingly, the color filters 160 may cover upper and side surfaces of the grid pattern 150 on the horizontal insulating layer 140.

The color filters 160 may include first to third color filters 160a, 160b, and/or 160c, etc., but the example embodiments are not limited thereto, and for example, there may be a greater or lesser number of color filters, etc. The grid pattern 150 may be between different colored color filters and/or between the same colored color filters.

The microlenses 170 may be on the color filters 160. Each of the microlenses 170 may have a convex shape in a direction distant from the first chip structure 3, for example, in a direction distant from the second substrate 106, but the example embodiments are not limited thereto. The microlenses 170 may condense and/or focus incident light onto the photoelectric conversion devices PD. The microlenses 170 may be formed of a transparent photoresist material and/or a transparent thermosetting resin material, etc., but are not limited thereto. For example, the microlenses 170 may be formed of a TMR-based resin, manufactured by Tokyo Ohka Kogo, Co., or an MFR-based resin manufactured by Japan Synthetic Rubber Corporation, but the example embodiments are limited thereto.

In at least one example embodiment, each of the microlenses 170 may vertically overlap each of the color filters 160.

The conductive layer 210 may cover at least a portion of an upper surface of the horizontal insulating layer 140. In at least one example embodiment, the conductive layer 210 may cover a portion of the upper surface of the horizontal insulating layer 140 in the second region R2 and the third region R3, but the example embodiments are not limited thereto.

In the optical black region OB of the second region R2, the conductive layer 210 may block light from entering the first and second reference regions PD' and NPD, etc. In the connection region BVS of the second region R2, the conductive layer 210 may serve as an electrical path between the first interconnection structure 15 and the second interconnection structure 127, but is not limited thereto. On the third region R3, the conductive layer 210 may serve as an electrical path between the first interconnection structure 15 and the conductive pad 215 which may be an input/output pad, etc.

In at least one example embodiment, the conductive layer 210 may include a metal nitride layer (for example, TiN, WN, or the like) and/or a metal layer (for example, Ti, W, Cu, Al, Cu, or Ag, or the like) stacked sequentially, but is not limited thereto.

In at least one example embodiment, the second chip structure 103 may further include at least one light blocking color filter layer 260. The light blocking color filter layer 260 may be on the conductive layer 210 in the optical black region OB of the second region R2, but is not limited thereto. In at least one example embodiment, the light blocking color filter layer 260 may extend from the optical black region OB to the connection region BVS on the conductive layer 210, but the example embodiments are not limited thereto. The light blocking color filter layer 260 may include a light blocking pattern for blocking light together with the conductive layer 210, etc. The light blocking color filter layer 260 may be formed together with the color filters 160 to have the same and/or substantially the same thickness (e.g., within +/−15% of the same thickness) as the color filters 160, but the example embodiments are not limited thereto. For example, the light blocking color filter layer 260 may include a blue color filter, but the example embodiments are not limited thereto.

In at least one example embodiment, the second chip structure 103 may further include an upper capping layer

250 on the light blocking color filter layer 260. The upper capping layer 250 may include a transparent photoresist material and/or a transparent thermosetting resin material, etc. The upper capping layer 250 may be a material layer formed together in the second region R2 in a deposition process for forming the microlenses 170 in the first region R1, but the example embodiments are not limited thereto. Accordingly, the upper capping layer 250 may include the same material as the microlenses 170, but is not limited thereto.

The optical black region OB may be used to reduce and/or remove a noise signal generated by a dark current. For example, in the state in which light is blocked by the conductive layer 210 and/or the light blocking color filter layer 260, the first reference region PD' including the photodiode may be used as a reference pixel to remove noise caused by and/or generated by a photodiode, for example, due to the dark current, etc. In addition, in the state in which light is blocked by the conductive layer 210 and/or the light blocking color filter layer 260, the second reference region NPD, which does not include a photodiode, may be a region for checking and/or comparing process noise to determine whether noise is caused by and/or generated by other components, rather than the photodiode, and/or to decrease and/or remove the process noise, etc.

In at least one example embodiment, the image sensor 1 may have a first via hole 310a, which may penetrate through at least a portion of the second chip structure 103 in the connection region BVS of the second region R2, and which may extend inward towards (e.g., may extend towards, etc.) the first chip structure 3, and a second via hole 310b penetrating through at least a portion of the second chip structure 103 in the third region R3 and extending inward towards the first chip structure 3.

The first via hole 310a and the second via hole 310b may sequentially penetrate through the horizontal insulating layer 140 and the second substrate 106, and may extend downward to sequentially penetrate through the isolation layer 118 and the second insulating layer 130, and may extend inward towards the first insulating layer 18. The first via hole 310a may expose a first pad 15p1 of the first interconnection structure 15 and/or a pad portion 127p of the second interconnection structure 127, etc., but is not limited thereto. The second via hole 310b may expose a second pad 15p2 of the first interconnection structure 15 and may be spaced apart from the second interconnection structure 127.

The conductive layer 210 may conformally cover a sidewall and/or a bottom surface of the first via hole 310a in the connection region BVS of the second region R2, but is not limited thereto. Accordingly, the conductive layer 210 may electrically connect the first pad 15p1 of the first interconnection structure 15 and the pad portion 127p of the second interconnection structure 127 to each other in the connection region BVS, etc. The conductive layer 210 may conformally cover a sidewall and/or a bottom surface of the second via hole 310b to each other in the third region R3, but is not limited thereto. Accordingly, the conductive layer 210 may be electrically connected to a second pad 15p2 of the first interconnection structure 15 in the third region R3.

In at least one example embodiment, the image sensor 1 may further include a plurality of gap-fill insulating layers, e.g., gap-fill insulating layers 340a and 340b, etc., respectively filling the first and second via holes 310a and 310b on the conductive layer 210 and having concave upper surfaces, and a plurality of buffer insulating layers 345a and 345b covering the gap-fill insulating layers 340a and 340b and having upper surfaces on a level higher than a level of the upper surface of the horizontal insulating layer 140, but the example embodiments are not limited thereto, and for example there may be a greater or lesser number of gap-fill insulating layers, via holes, and/or buffer insulating layers, etc. The buffer insulating layers 345a and 345b may include a cured photoresist material, but is not limited thereto.

The conductive pad 215 may contact the conductive layer 210 on the conductive layer 210 in the third region R3, but the example embodiments are not limited thereto.

In at least one example embodiment, the second substrate 106 may have at least one recess portion 106r extending inward toward the second substrate 106 from the second surface 106s2 in the third region R3. The conductive layer 210 may cover a sidewall and/or a bottom surface of the recess portion 106r while covering the upper surface of the horizontal insulating layer 140, but is not limited thereto. The conductive pad 215 may be in the recess portion 106r. For example, the conductive pad 215 may be buried in the recess portion 106r of the second substrate 106, but the example embodiments are not limited thereto.

A lower surface of the conductive pad 215 may contact the conductive layer 210. A side surface of the conductive pad 215 may be spaced apart from the conductive layer 210. An upper surface of the conductive pad 215 may be on a level which is a higher level than a level of the second surface 106s2 of the second substrate 106 or may be on the same and/or substantially the same level (e.g., within +/−15% of the same height, etc.) as the upper surface of the horizontal insulating layer 140. However, the example embodiments are not limited thereto, and the upper surface of the conductive pad 215 may be on a level lower than the level of the second surface 106s2 of the second substrate 106.

The conductive pad 215 may include a conductive material, different from a material of the conductive layer 210, for example, aluminum (Al), etc. Additionally, the conductive pad 215 may include the same material as the conductive layer 210.

A first passivation layer 230 may cover the conductive layer 210 on the horizontal insulating layer 140, but is not limited thereto. The first passivation layer 230 may be a material layer for decreasing and/or preventing corrosion of the conductive layer 210 caused by humidification and/or the like. In the second region R2, the first passivation layer 230 may be between the conductive layer 210 and the light blocking color filter layer 260, and may be between the conductive layer 210 extending inward towards the first via hole 310a and the first gap-fill insulating layer 340a, but the example embodiments are not limited thereto. In the third region R3, the first passivation layer 230 may be between the conductive layer 210 and the second passivation layer 240, and may be between the conductive layer 210, extending inward towards the second via hole 310b, and the second gap-fill insulating layer 340b, but is not limited thereto. In addition, the first passivation layer 230 may cover the exposed upper surface of the horizontal insulating layer 140, which the conductive layer 210 is not on in the second region R2 and/or the third region R3, but is not limited thereto.

The first passivation layer 230 may include the same material as the grid pattern 150, but the example embodiments are not limited thereto. In at least one example embodiment, the first passivation layer 230 may have the same and/or substantially the same thickness (e.g., within +/−15% of the same thickness) as the grid pattern 150. When the grid pattern 150 has a multilayer structure, the first passivation layer 230 may also have a multilayer structure, but is not limited thereto.

In at least one example embodiment, the first passivation layer 230 may extend from a portion covering the conductive layer 210 on the horizontal insulating layer 140 and may cover a side surface of the conductive layer 210 in the recess portion 106r, etc.

Referring to FIG. 5 together, in the recess portion 106r, the first passivation layer 230 may include at least one first portion 230P1 covering the side surface of the conductive layer 210, at least one second portion 230P2 extending from the first portion 230P1 to cover a bottom surface of the conductive layer 210, at least one third portion 230P3 extending from the second portion 230P2 to cover a side surface of the conductive pad 215, and/or at least one fourth portion 230P4 extending from the third portion 230P3 to cover at least a portion of the upper surface of the conductive pad 215. In at least one example embodiment, the bottom surface of the conductive layer 210 in the recess 106r may refer to an upper surface of a horizontal extension portion of the conductive layer 210 covering a bottom surface of the recess portion 106r. An upper end of the third portion 230P3 may be on a level higher than a level of an upper surface of the conductive pad 215, but is not limited thereto. Although a portion of the top surface of the conductive pad 215 is covered with the fourth portion 230P4, remaining portions thereof may be exposed to the outside, but the example embodiments are not limited thereto.

For example, the first passivation layer 230 may cover a portion of the second surface 106s2 of the second substrate 106, a side surface of the recess portion 106r, a portion of a bottom surface of the recess portion 106r, and/or a side surface of the conductive pad 215, etc., but is not limited thereto. The conductive layer 210 may extend between the first passivation layer 230 and the second surface 106s2 of the second substrate 106, between the first passivation layer 230 and the side surface of the recess portion 106r, between the first passivation layer 230 and a portion of the bottom surface of the recess portion 106r, and/or between the lower surface of the conductive pad 215 and a portion of the bottom surface of the recess portion 106r, etc.

The first portion 230P1 of the first passivation layer 230 may have at least one groove portion, but is not limited thereto. The groove portion may be a portion in which a portion of the first passivation layer 230 is recessed into the first passivation layer 230. The groove portion may be formed due to a processing defect (e.g., a manufacturing defect, etc.), in which a first passivation layer fails to be conformally formed along a side surface and a bottom surface of the recess portion 106r during a deposition process of forming the first passivation layer 230. This may be because the first passivation layer 230 includes a material having a relatively low step coverage in comparison to the other components of the image sensor. Moisture permeation caused by humidification and/or water exposure, etc., may be relatively large in the groove portion, so corrosion of the conductive layer 210 and/or increased corrosion may occur, resulting in reduced reliability, endurance, and/or productivity of the image sensor, etc.

The second passivation layer 240 may cover the first passivation layer 230 in the third region R3. The second passivation layer 240 may be a material layer for decreasing and/or preventing corrosion of the conductive layer 210 together with the first passivation layer 230 while covering the groove portion of the first passivation layer 230. In the third region R3, the second passivation layer 240 may be on the first passivation layer 230 and may cover the side surface of the first passivation layer 230 in the recess 106r, etc., but is not limited thereto.

The second passivation layer 240 may include at least one protrusion 240P extending inward towards the first passivation layer 230 from a side surface of the first passivation layer 230 in the recess portion 106r. The protrusion 240P may be on a level lower than a level of an upper surface of the first passivation layer 230, but is not limited thereto. The protrusion 240P may be a portion of the second passivation layer 240 filling the groove portion of the first passivation layer 230. For example, the protrusion 240P may be convex toward the side surface of the first passivation layer 230, but the example embodiments are not limited thereto.

The second passivation layer 240 may have a surface opposing the protrusion 240P in the recess portion 106r, and the surface may not have a groove portion or may have a groove portion having a size smaller than a size of the groove portion of the first passivation layer 230. In this case, the second passivation layer 240 may include a material having a step coverage higher than the step coverage of a material of the first passivation layer 230, but the example embodiments are not limited thereto. The second passivation layer 240 may cover the groove portion of the first passivation layer 230 formed in the recess portion 106r, and thus, an image sensor having improved reliability, endurance, and/or productivity may be provided.

In at least one example embodiment, the second passivation layer 240 may cover the plurality of portions, e.g., first to fourth portions 230P1, 230P2, 230P3, and 230P4, etc., of the first passivation layer 230. A side surface of the second passivation layer 240 may be coplanar and/or substantially coplanar (e.g., within +/−15% of coplanar) with a side surface of the fourth portion 230P4. The second passivation layer 240 may cover an upper end of the fourth portion 230P4. The second passivation layer 240 may be spaced apart from the conductive layer 210 by the first passivation layer 230.

The second passivation layer 240 may have a thickness greater than and/or higher than a thickness of the first passivation layer 230, but the example embodiments are not limited thereto.

In at least one example embodiment, the second passivation layer 240 may include a transparent photoresist material and/or a thermosetting resin material, etc., but is not limited thereto. The second passivation layer 240 may be a material layer formed together in the third region R3 during a deposition process of forming the microlenses 170, but is not limited thereto. Accordingly, the second passivation layer 240 may include the same material as the microlenses 170, but is not limited thereto. In this case, the second passivation layer 240 may be a material layer extending from the upper capping layer 250 of the second region R2. Accordingly, an upper surface of the second passivation layer 240 and an upper surface of the upper capping layer 250 may be on the same and/or substantially the same level (e.g., within +/−15% of each height).

According to some example embodiments, the second passivation layer 240 may include a material different from a material of the microlenses 170, for example, a material in which a pigment including a metal and/or a metal oxide is mixed with a resin, etc., and may be separate from the upper capping layer 250 to have a distinct boundary therewith, but the example embodiments are not limited thereto.

In at least one example embodiment, the image sensor 1 may further include a separation pattern 140p penetrating through the second substrate 106 in the third region R3. In an example, the separation pattern 140p may extend from at least a portion of the horizontal insulating layer 140, but is not limited thereto.

Hereinafter, various modified examples of the above-described components of the image sensor according to one or more additional example embodiments will be described. In the various modified examples of the components of the image sensor to be described below, modified components and/or replaced components will be mainly described. In addition, modifiable and/or replaceable components will be described with reference to drawings thereof, but the replaceable components may be combined with each other to constitute an image sensor according to at least one example embodiment.

Figure 6A:
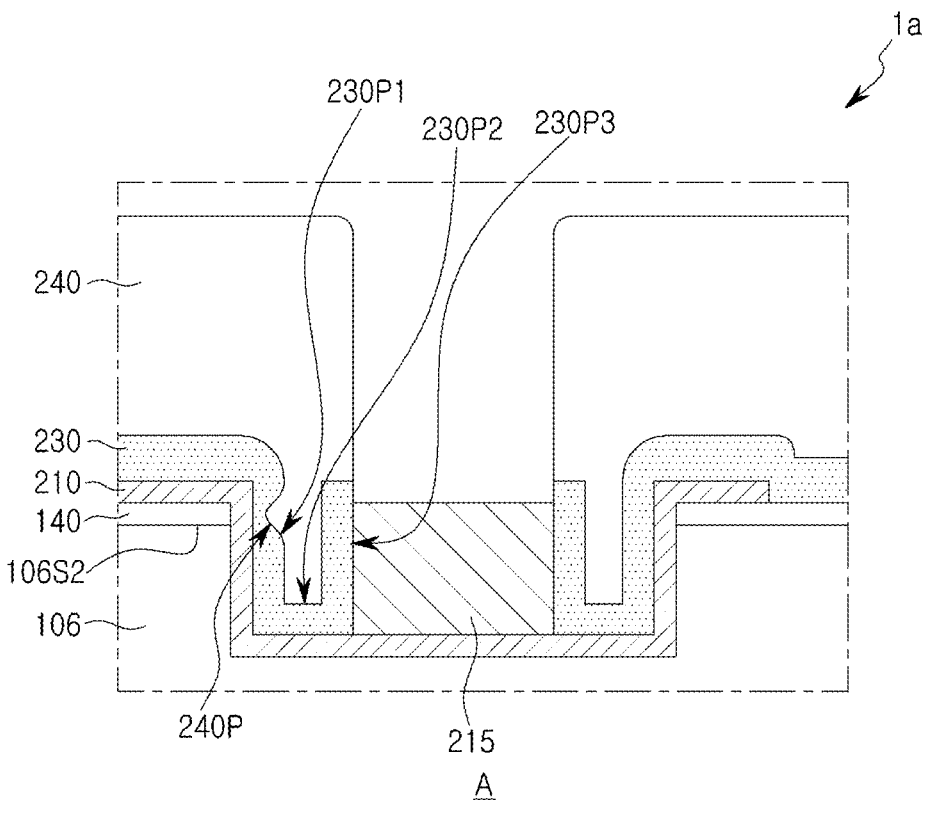
FIGS. 6A to 6D are partially enlarged views of a portion of an image sensor according to some example embodiments.

Referring to FIG. 6A, an image sensor 1a may have structures of first and second passivation layers 230 and 240, different from those of the at least one example embodiment discussed in connection with FIG. 5. According to at least one example embodiment, the first passivation layer 230 may not include the fourth portion 230P4. For example, the first passivation layer 230 may include a third portion 230P3 extending along a side surface of a conductive pad 215, and may not include a portion extending upward from an upper surface of the conductive pad 215, but the example embodiments are not limited thereto. The second passivation layer 230 may cover an upper end of the third portion 230P3 and may have a side surface coplanar and/or substantially coplanar with the side surface of the conductive pad 215. Accordingly, the upper surface of the conductive pad 215 may be exposed and/or completely exposed.

The upper surface of the conductive pad 215 may be exposed because the first and second passivation layers 230 and 240 are etched using an etching mask completely aligned with a plane of the conductive pad 215 during an etching process of exposing the upper surface of the conductive pad 215, but the example embodiments are not limited thereto.

Figure 6B:
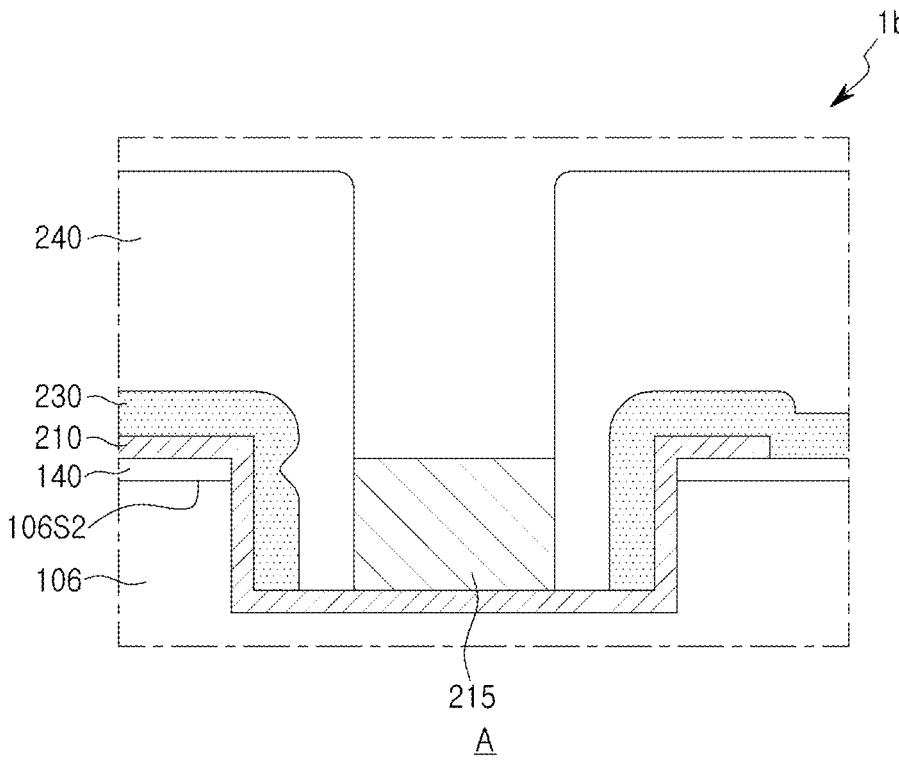

Referring to FIG. 6B, an image sensor 1b may have structures of first and second passivation layers 230 and 240, different from those of the at least one example embodiment discussed in connection with FIG. 5. The first passivation layer 230 may cover a side surface of a conductive layer 210 in a recess portion 106r, and may not cover a bottom surface of the conductive layer 210 and/or a side surface of the conductive pad 215, but the example embodiments are not limited thereto. The second passivation layer 240 may extend between the first passivation layer 230 and the conductive pad 215 in the recess portion 106r to contact the conductive layer 210, but is not limited thereto. This may be a structure formed by adding a separate etching process on the conductive pad 215, but the example embodiments are not limited thereto.

Figure 6C:
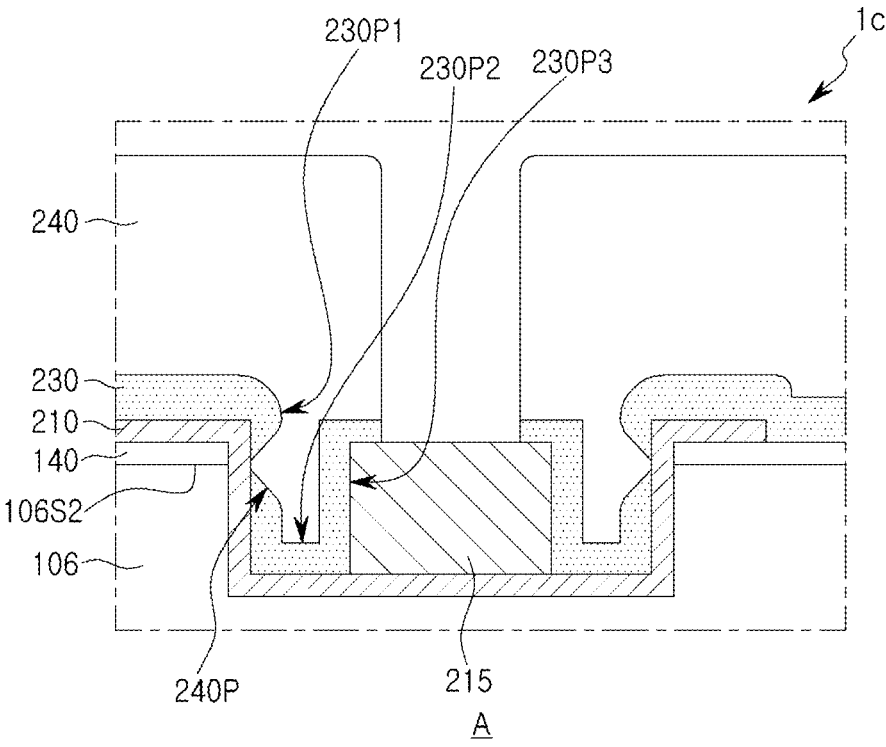

Referring to FIG. 6C, a groove portion of a first passivation layer 230 may be formed to be relatively larger than the groove portion illustrated in FIG. 5 to expose a portion of a conductive layer 210 in a recess portion 106r. A protrusion 240P of a second passivation layer 240 may fill the groove portion, and thus may contact the exposed conductive layer 210. This may be because the groove portion is formed to be large depending on a material of the first passivation layer 230, a depth of the recess portion 106r, and/or process conditions, etc.

Figure 6D:
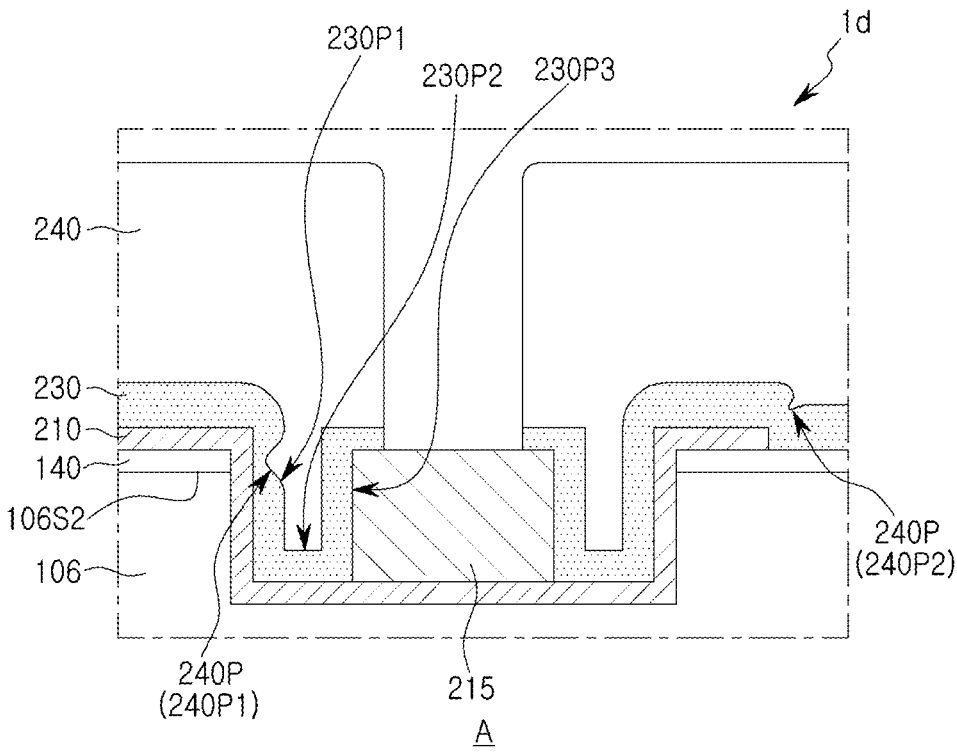

Referring to FIG. 6D, an image sensor 1d may have structures of first and second passivation layers 230 and 240, different from those of the at least one example embodiment discussed in connection with FIG. 5.

In at least one example embodiment, at least one protrusion 240P of the second passivation layer 240 may include a first protrusion 240P1 and/or a second protrusion 240P2, etc. The first protrusion 240P1 may have characteristics which are the same as or similar to those of the protrusion described with reference to FIG. 5. For example, the first protrusion 240P1 may extend inward towards a first passivation layer 230 from a side surface of the first passivation layer 230 in a recess portion 106r, but the example embodiments are not limited thereto.

The second protrusion 240P2 may be a region extending toward the conductive layer 210 from a region outside (and/or external to) the recess portion 106r. The conductive layer 210 may have an end portion (e.g., a first end) exposing a portion of a horizontal insulating layer 140 in the third region R3. The end portion may be a region for electrical separation of the conductive layer 210 between the third region R3 and a second region R2, and/or a region for electrical separation between adjacent conductive layers in the third region R3, etc. The first passivation layer 230 may cover the end portion and the exposed horizontal insulating layer 140, but is not limited thereto. As the first passivation layer 230 covers the upper end and includes a material having a relatively low step coverage, similar to what is described with reference to FIG. 5, the first passivation layer 230 may have a groove portion in a region adjacent to the end portion. As the second passivation layer 240 includes a material having a step coverage which is higher than the step coverage of a material of the first passivation layer 230, the second passivation layer 240 may cover the groove portion and may relatively and/or conformally cover the first passivation layer 230. The second protrusion 240P2 may fill the groove portion and may extend inward towards the first passivation layer 230 toward the end portion.

Figure 7A:
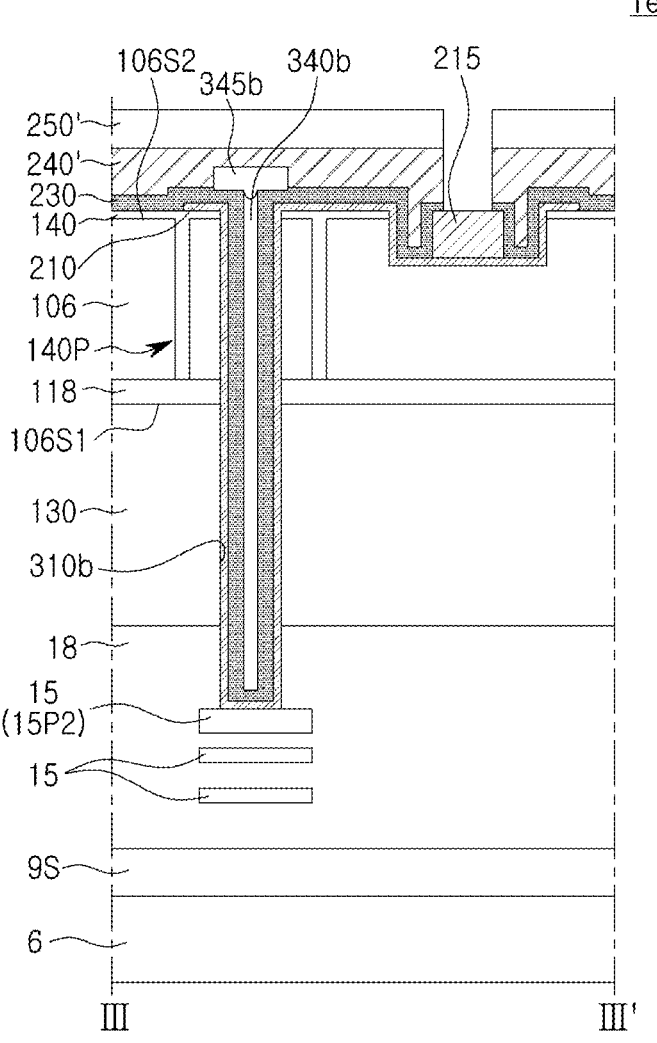
FIGS. 7A and 7B are schematic cross-sectional views illustrating an image sensor according to some example embodiments.
Figure 7B:
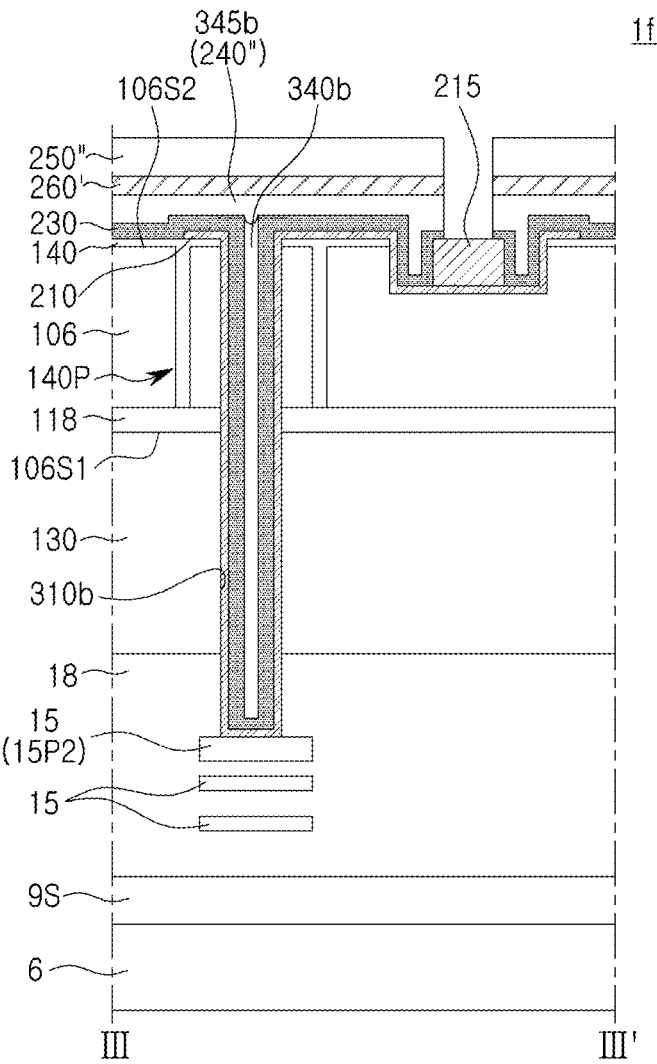

FIGS. 7A and 7B are schematic cross-sectional views illustrating an image sensor according to some example embodiments.

Referring to FIG. 7A, an image sensor 1e may have a structure of a second passivation layer 240', different from that of the at least one example embodiment discussed in connection with FIGS. 2 to 5. The second passivation layer 240' may include at least one material in which a pigment, including a metal and/or a metal oxide, is mixed with a resin, but the example embodiments are not limited thereto. The second passivation layer 240' may be at least one material layer formed together in a third region R3 using a deposition process of forming a light blocking color filter layer 260 (see, e.g., FIG. 3) of a second region R2, but the example embodiments are not limited thereto. Accordingly, the second passivation layer 240' may include the same material as the light blocking color filter layer 260, but is not limited thereto. The second passivation layer 240' may be on the same and/or substantially the same level (e.g., within +/−15% of the same height, etc.) as an upper surface of the light blocking color filter layer 260, but is not limited thereto.

In at least one example embodiment, an upper capping layer 250 (see, e.g., FIG. 3) of the second region R2 may extend to the third region R3, so that a light blocking color filter layer 260' and/or an upper capping layer 250'' may also be on the second passivation layer 240' in the third region R3, but the example embodiments are not limited thereto. In the drawings, the upper capping layer 250' and the second passivation layer 240' are illustrated as having a coplanar and/or a substantially coplanar surface in a region adjacent to a recess portion 106r. However, the example embodiments are not limited thereto and the upper capping layer 250' and the second passivation layer 240' may have openings having different widths, etc.

Referring to FIG. 7B, an image sensor if may have a structure of a second passivation layer 240", different from that of the one or more example embodiments discussed in connection with FIGS. 2 to 5, but the example embodiments are not limited thereto. For example, the second passivation layer 240" may include a cured photoresist material, but is not limited thereto. The second passivation layer 240" may be formed together in a deposition process of forming a second buffer insulating layer 345b to cover a first passivation layer 230, but is not limited thereto. Accordingly, the second passivation layer 240" may be on the same and/or substantially the same level (e.g., within +/−15% of the same height, etc.) as an upper surface of the second buffer insulating layer 345b, but is not limited thereto.

In at least one example embodiment, a light blocking color filter layer 260 (see, e.g., FIG. 3) and an upper capping layer 250 (see, e.g., FIG. 3) in a second region R2 may extend inwardly of a third region R3, so that a light blocking color filter layer 260' and/or an upper capping layer 250" may also be on second passivation layer 240", but the example embodiments are not limited thereto.

Figure 8:
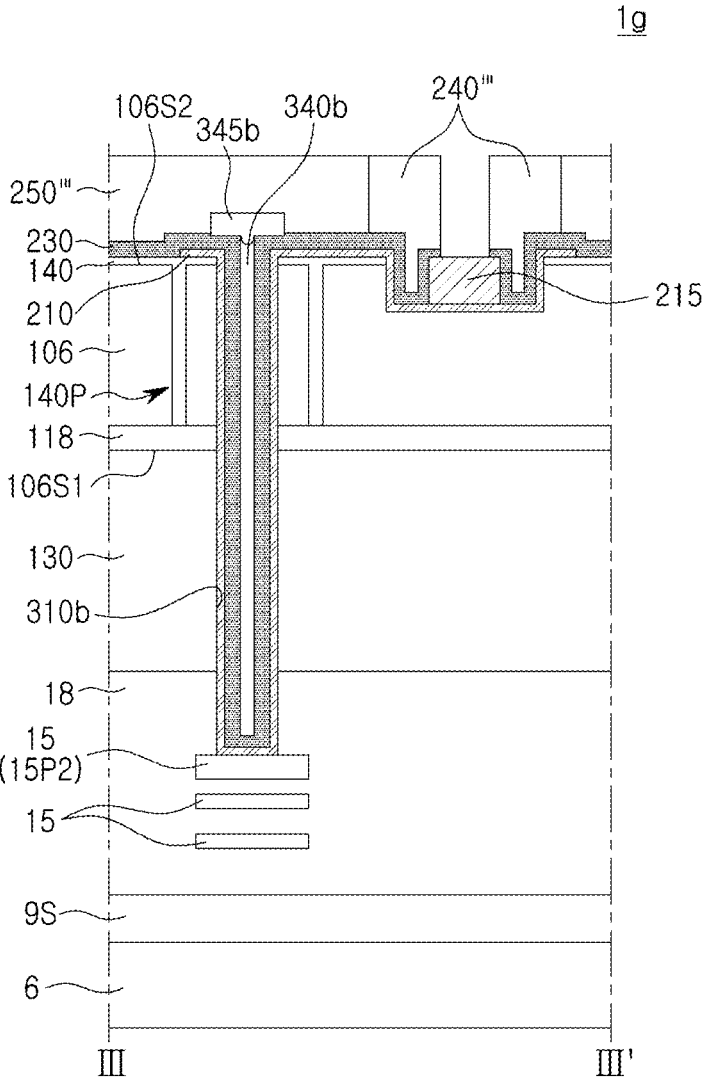
FIG. 8 is a schematic cross-sectional view illustrating an image sensor according to some example embodiments.

FIG. 8 is a schematic cross-sectional view illustrating an image sensor according to some example embodiments.

Referring to FIG. 8, an image sensor 1f may have a structure of a second passivation layer 240''', different from that of one or more of the example embodiments described in connection with FIGS. 2 to 5. The second passivation layer 240''' may be formed through a deposition process, separate from a deposition process of forming an upper capping layer 250, a light blocking color filter layer 260, and/or a second buffer insulating layer 345b, etc., but is not limited thereto. According to some example embodiments, the second passivation layer 240''' may include a material, different from materials of the upper capping layer 250, the light blocking color filter layer 260, and/or the second buffer insulating layer 345b, etc. Additionally, according to other example embodiments, even the second passivation layer 240 includes the same material as the upper capping layer 250, an interface with the capping layer 250, and the light blocking color filter layer 260, and the second buffer insulating layer 345b may be distinct depending on process conditions.

Figure 9:
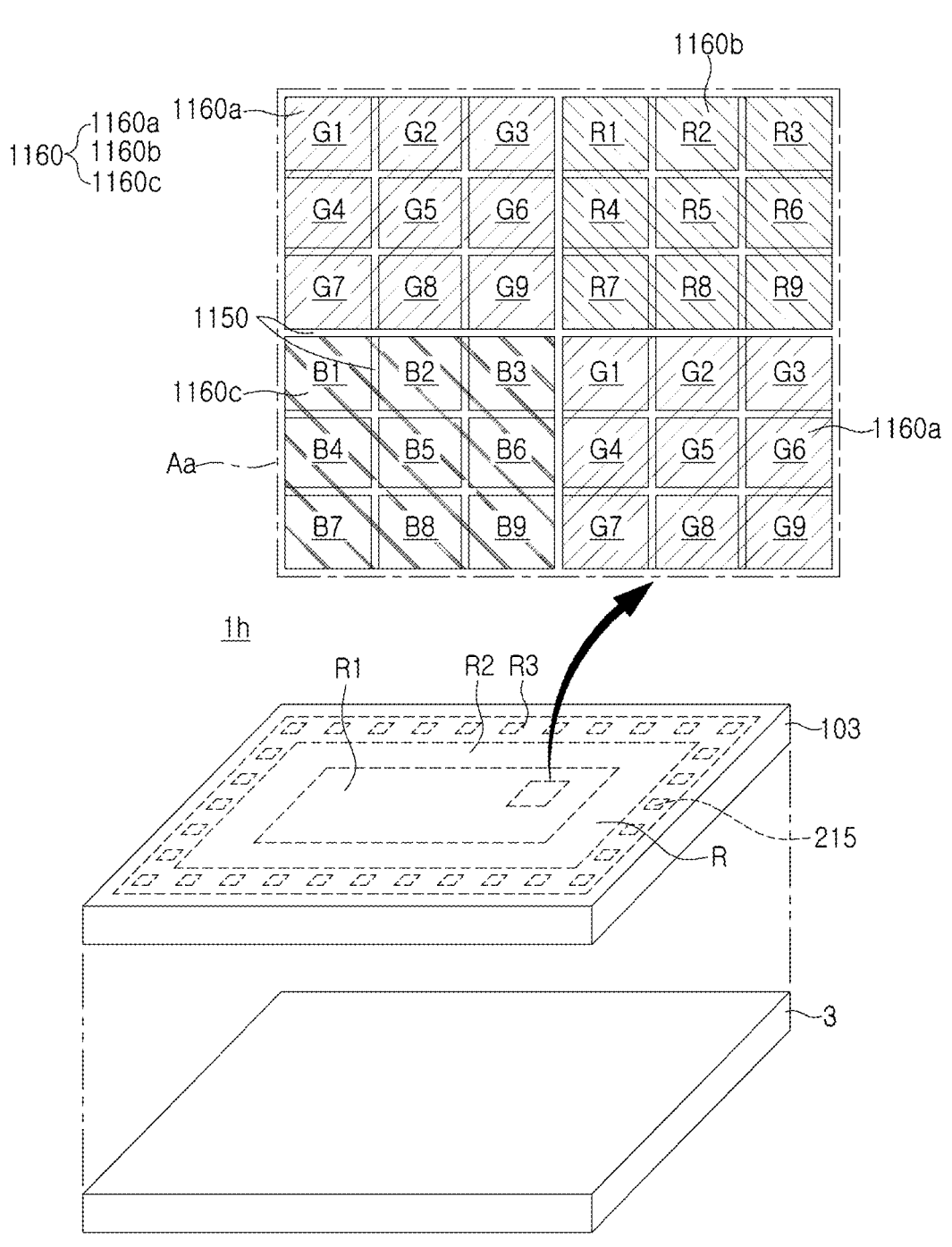
FIG. 9 is a schematic diagram illustrating an image sensor according to at least one example embodiment.
Figure 10:
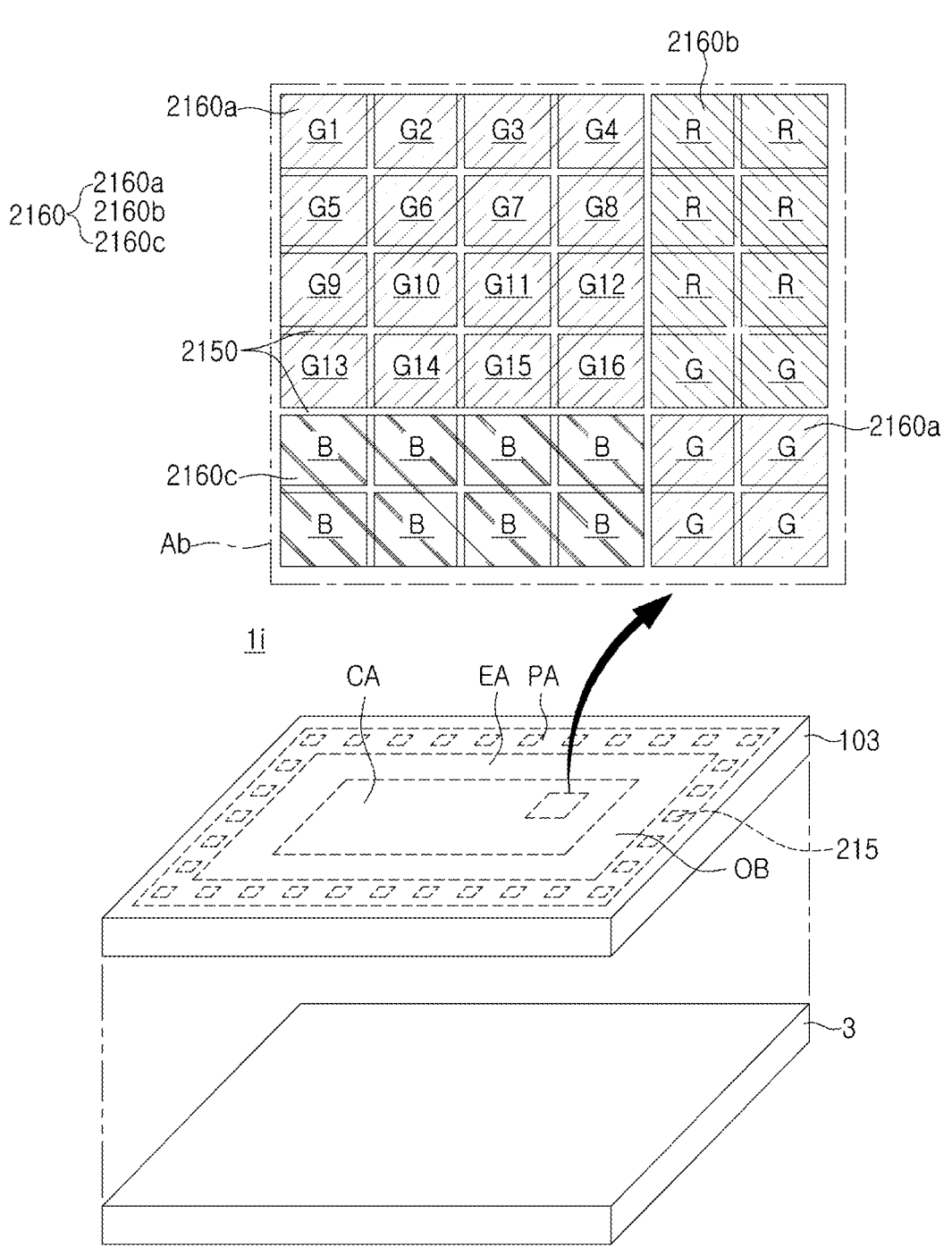
FIG. 10 is a schematic diagram illustrating an image sensor according to at least one example embodiment.

FIGS. 9 and 10 are schematic diagrams illustrating an image sensor according to at least one example embodiment. Modified examples of the above-described color filters 160 will be described with reference to FIGS. 9 and 10.

Referring to FIG. 9, color filters 1160 may include a plurality of first color filters 1160a of a first color, a plurality of second color filters 1160b of a second color, and/or a plurality of third color filters 1160c of a third color, etc., but the example embodiments are not limited thereto, and for example, there may be sets of filters corresponding to a greater or lesser number of colors than three. One of the first color filter 1160a may overlap nine pixel regions represented by G1 to G9, one of the second color filters 1160b may overlap nine pixel regions represented by R1 to R9, and/or one of the third color filters 1160c may overlap nine pixel regions represented by B1 to B9, etc., but the example embodiments are not limited thereto. Similarly to the grid pattern 150 described with reference to FIG. 1, a grid pattern 1150 may be in the form of a grid including horizontal portions and vertical portions, intersecting each other in a perpendicular direction, between the color filters 1160, but is not limited thereto.

Referring to FIG. 10, the plurality of color filters 2160 may include first color filters 2160a of a first color, second color filters 2160b of a second color, and/or third color filters 2160c of a third color, etc., but is not limited thereto. One of the first color filters 2160a may overlap 16 pixel regions represented by G1 to G16, one of the second color filter 2160b may overlap 16 pixels represented by R1 to R16, and/or one of the third color filters 2160c may overlap 16 pixel regions represented by B1 to B16, etc., but the example embodiments are not limited thereto. Similar to the grid pattern 150 described with reference to FIG. 1, the grid pattern 2150 may be in the form of a grid including horizontal portions and vertical portions, intersecting each other in a perpendicular direction, between the color filters 2160, but the example embodiments are not limited thereto.

Figure 11:
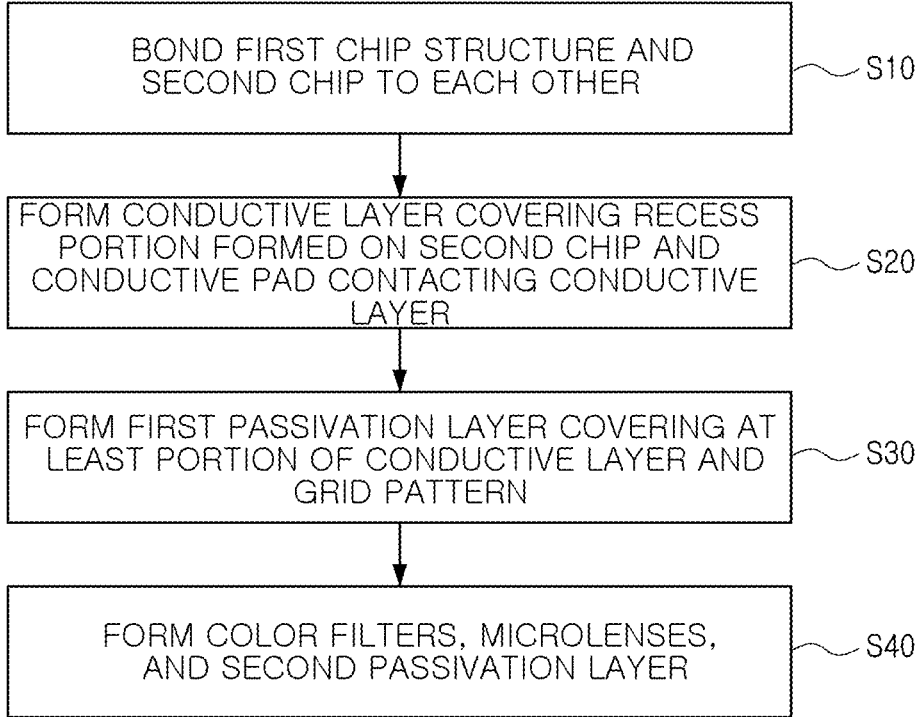
FIG. 11 is a schematic flowchart illustrating a method of manufacturing an image sensor according to some example embodiments.

FIG. 11 is a schematic flowchart illustrating a method of manufacturing an image sensor according to some example embodiments.

Figure 12A:
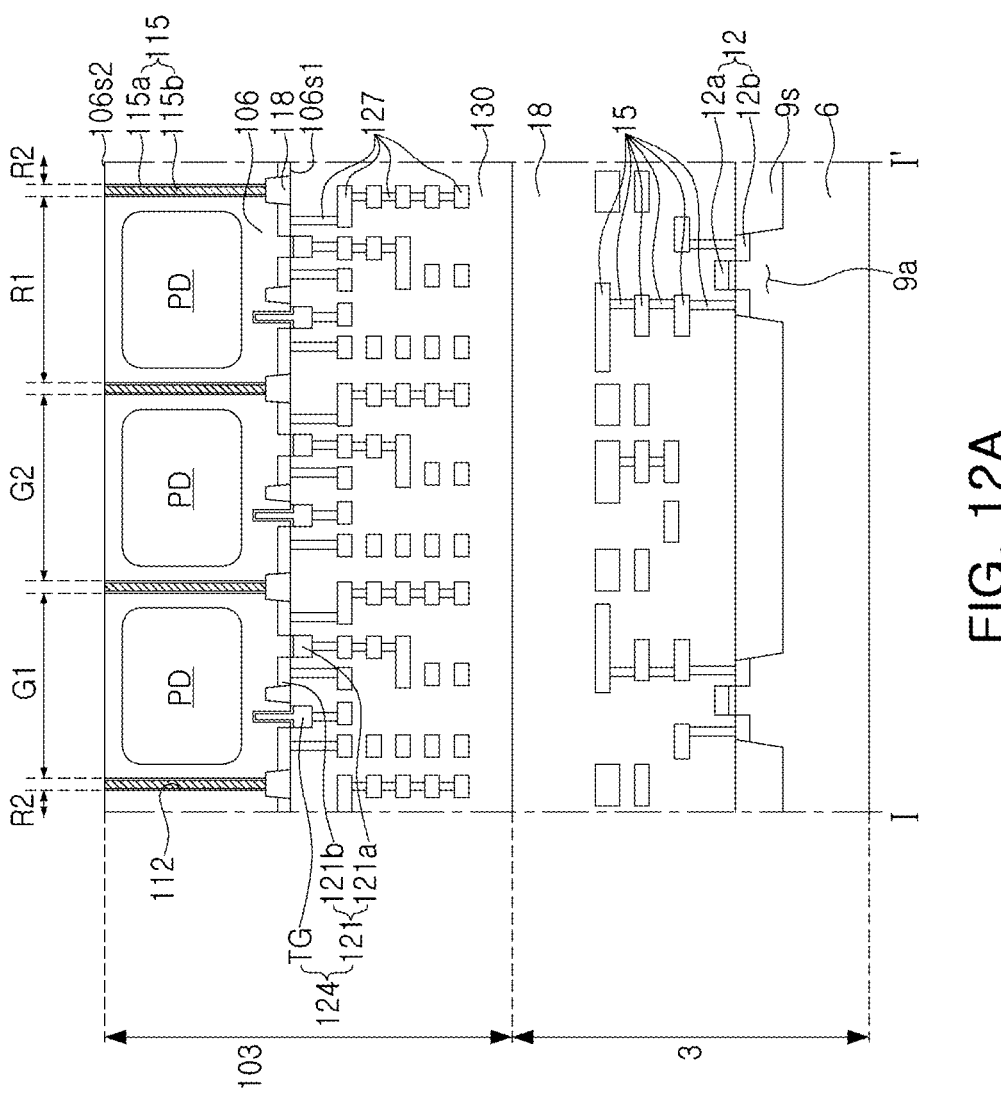
FIGS. 12A to 14C are cross-sectional views illustrating a method of manufacturing an image sensor according to some example embodiments.
Figure 12B:
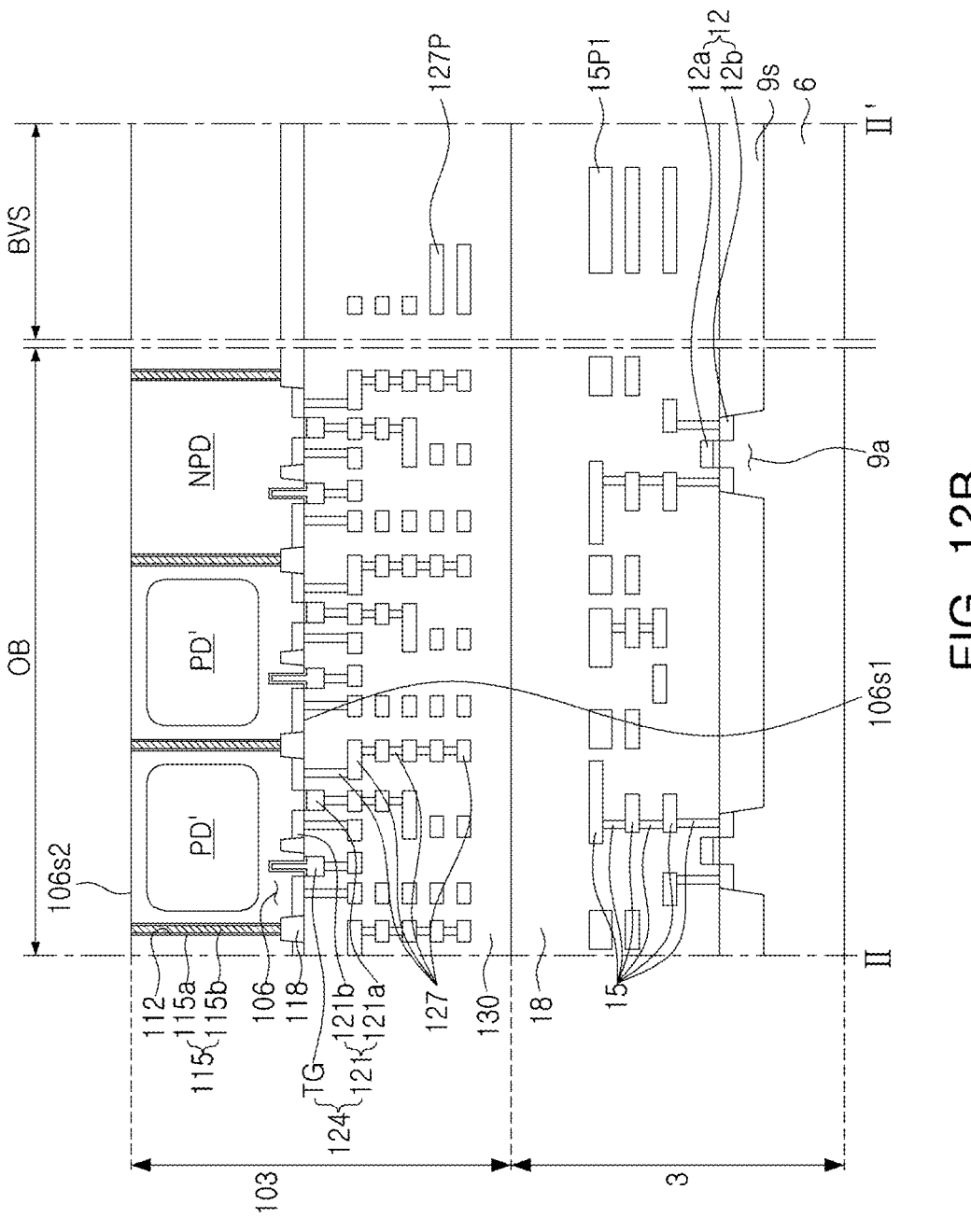
Figure 12C:
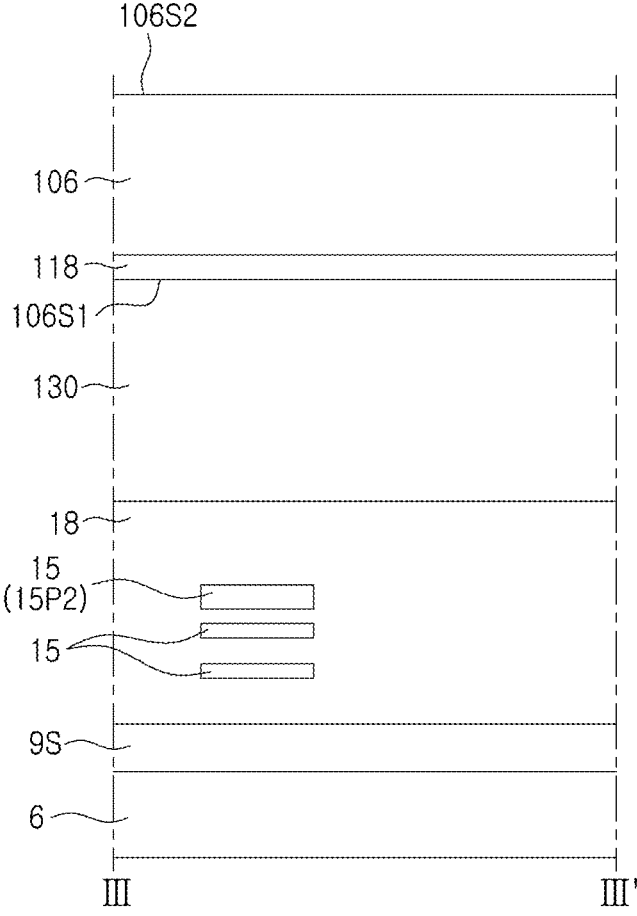
Figure 13A:
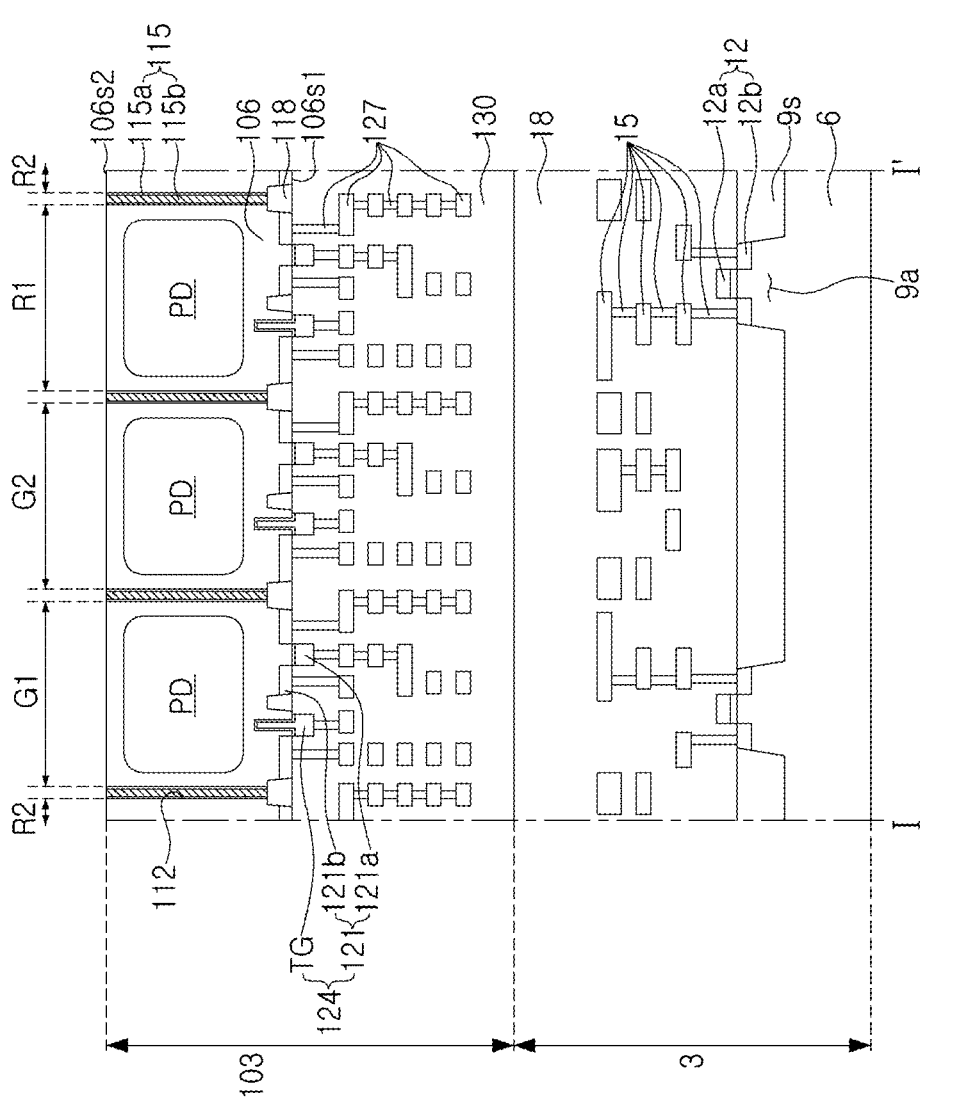
Figure 13B:
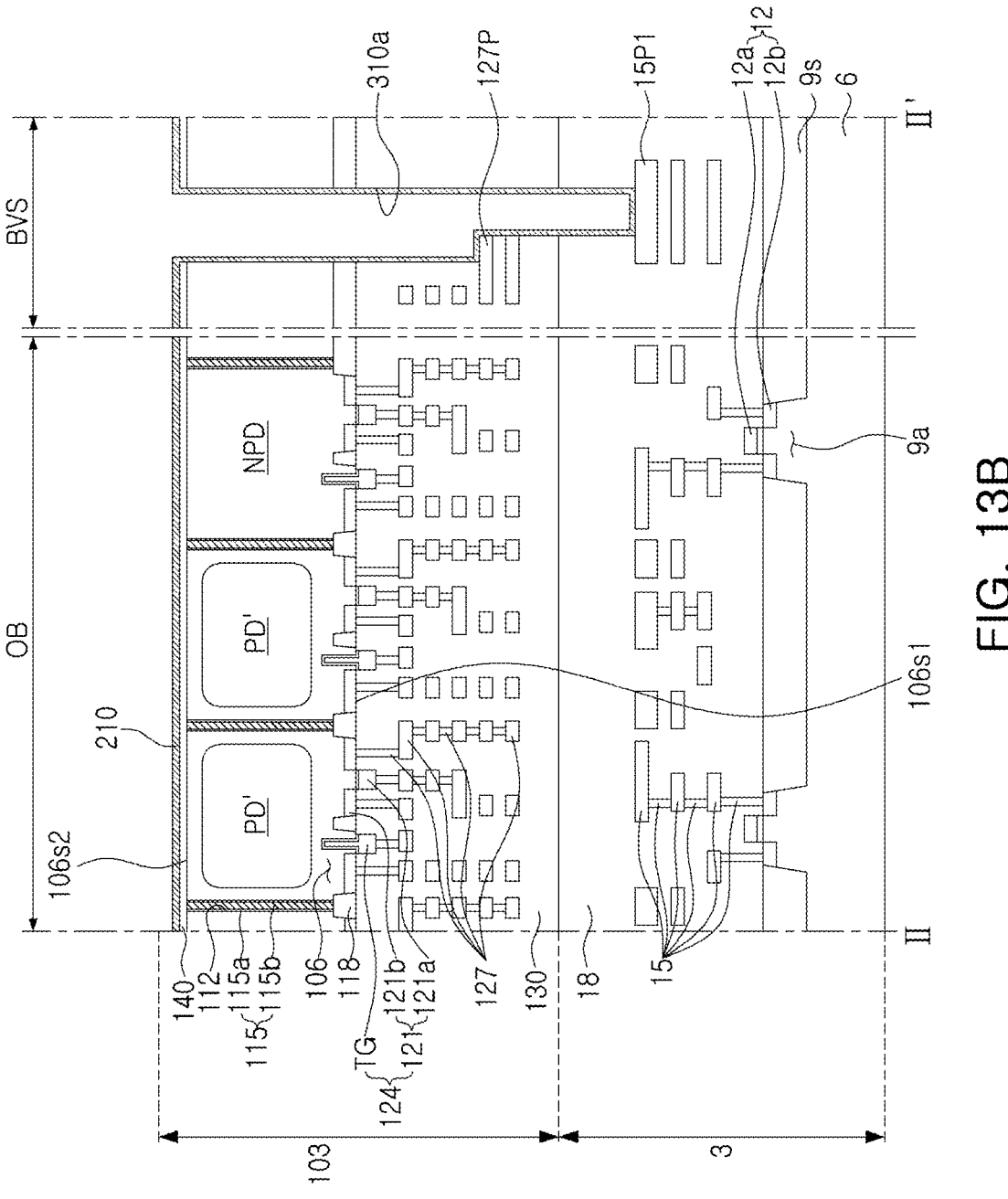
Figure 13C:
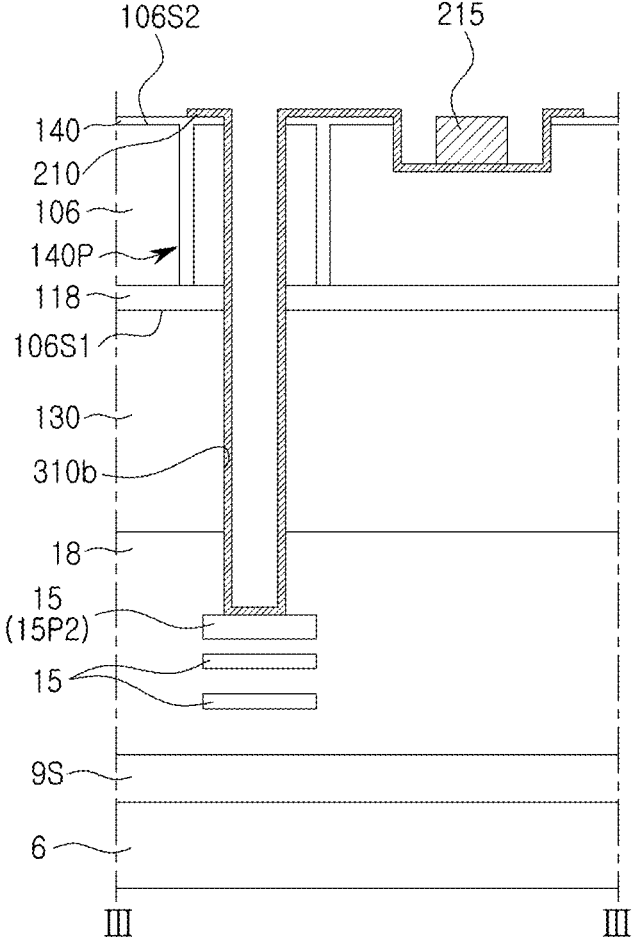
Figure 14A:
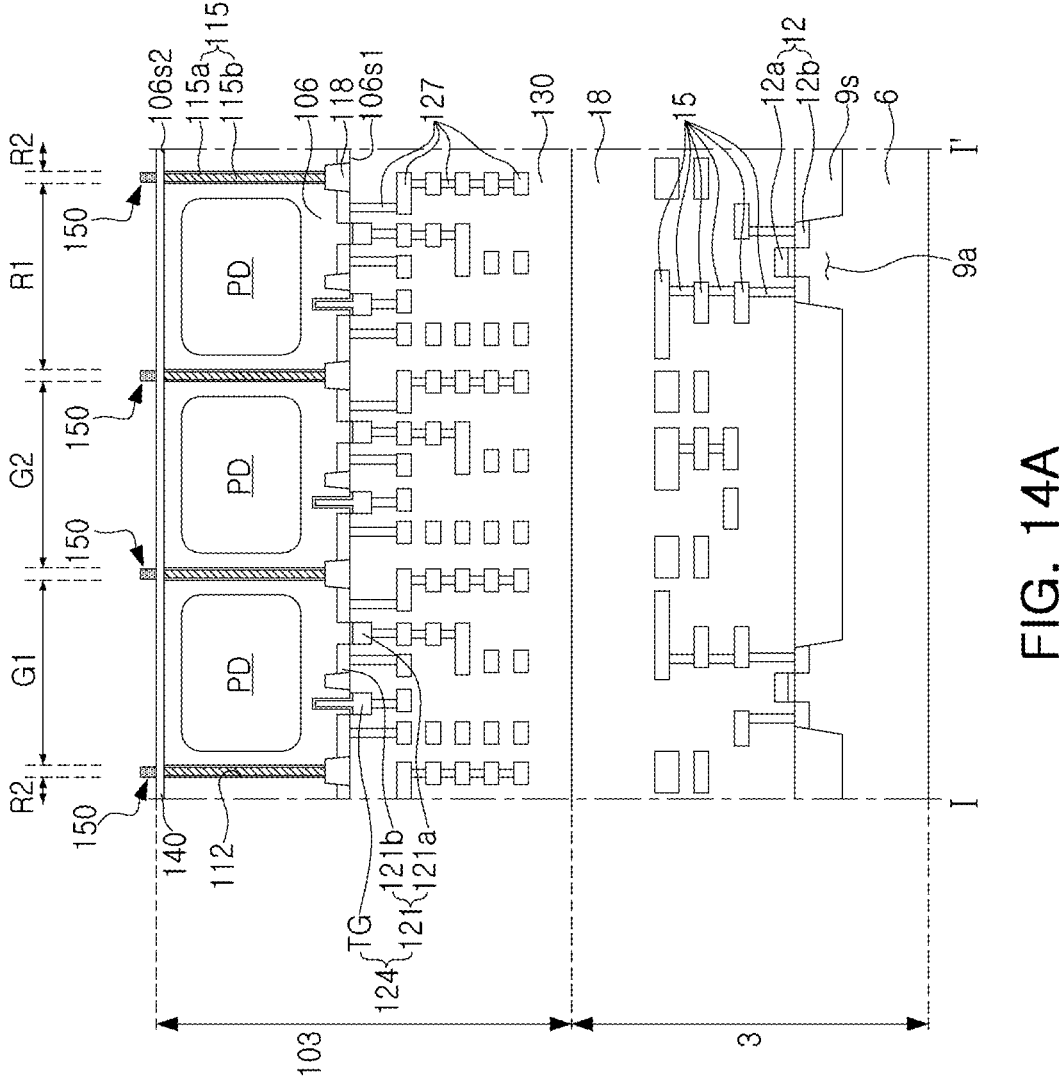
Figure 14B:
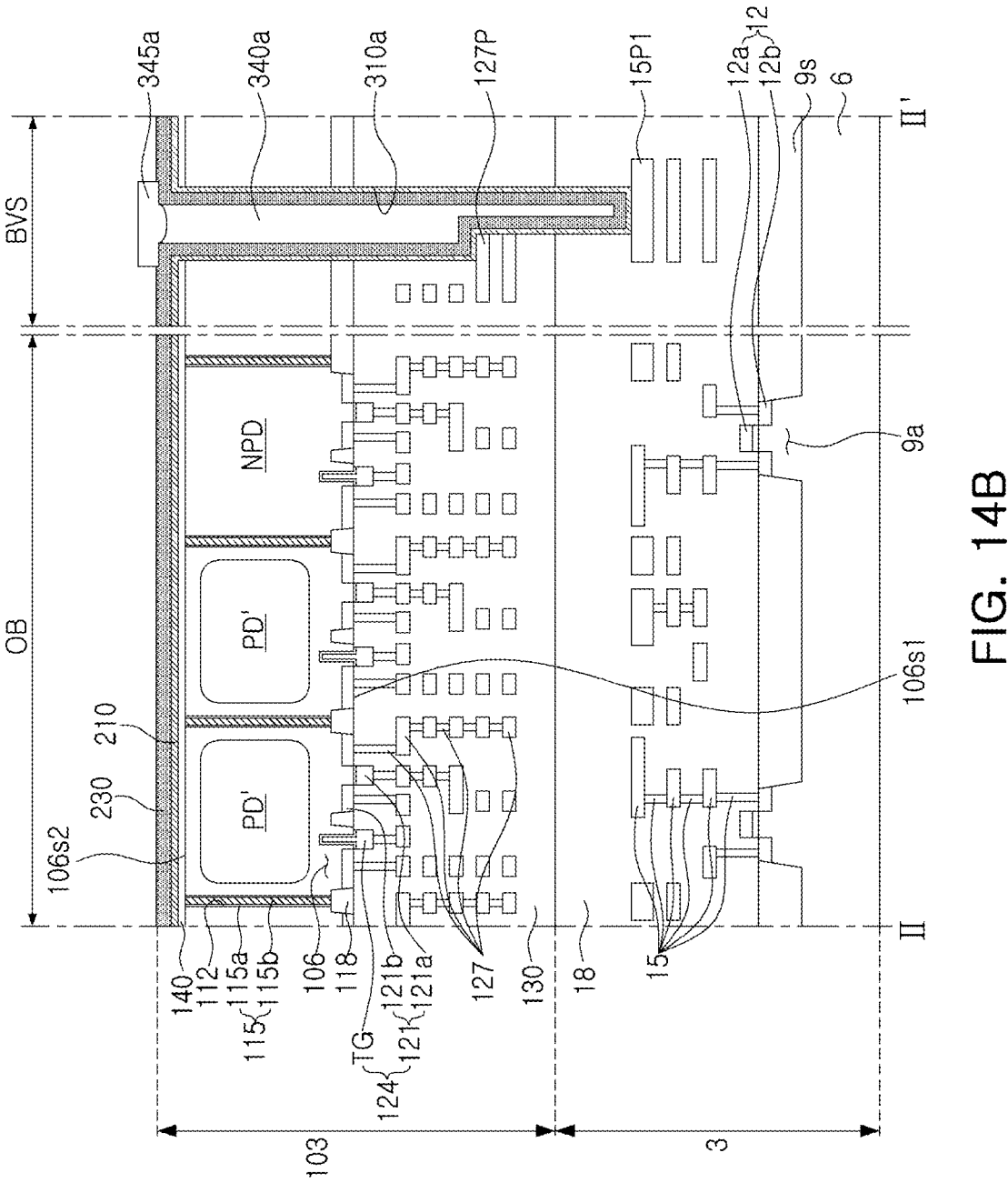
Figure 14C:
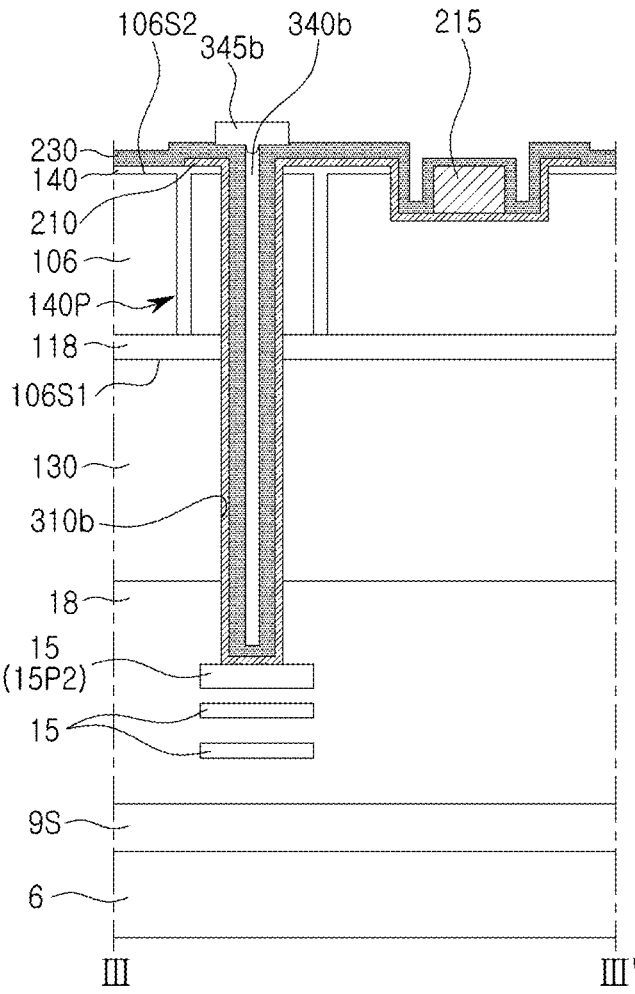

FIGS. 12A to 14B are cross-sectional views illustrating a method of manufacturing an image sensor according to some example embodiments. FIGS. 12A, 13A, and 14A illustrate a region corresponding to FIG. 2, FIGS. 12B, 13B, and 14B illustrate a region corresponding to FIG. 3, and FIGS. 12C, 13C, and 14C illustrate a region corresponding to FIG. 4.

Referring to FIGS. 11 and 12A to 12C, in operation S10, a first chip structure 3 and a second chip 103 may be bonded to each other.

Initially, a first chip structure 3 may be formed. The forming the first chip structure 3 may include preparing a first substrate 6, forming an isolation layer 9s to define an active region 9a on the first substrate 6, forming a first circuit device 12 on the first substrate 6, forming a first interconnection structure to be electrically connected to the first circuit device 12 on the first substrate 6, and/or forming a first insulating layer 18 to cover the first circuit device 12 and the first interconnection structure 15, etc., but the example embodiments are not limited thereto.

A second chip 103a having a plurality of regions, e.g., first to third regions R1, R2, and R3 (see, e.g., FIG. 1) may be formed. The forming the second chip 103 may include preparing a second substrate 106 having a first surface 106s1 and a second surface 106s2 opposite each other, forming a separation structure 115 and one or more photoelectric conversion devices PD in the second substrate 106, forming an isolation layer 118 to define an active region on a first surface 106s1 of the second substrate 106, forming a second circuit device 124 on the first surface 106s1 of the second substrate 106, forming a second interconnection structure 127 on the first surface 106s1 of the second substrate 106, and/or forming a second insulating layer 130 to cover the second circuit device 124 and the second interconnection structure 127, etc., but the example embodiments are not limited thereto. The order of forming the first chip structure 3, the second chip 103a, the separation structure 115, the photoelectric conversion devices PD, and/or the isolation layer 118 may vary.

Then, a wafer bonding process of bonding two wafers to each other may be performed to bond the first chip structure 3 and the second chip 103 to each other. The first insulating layer 18 of the first chip structure 3 and the second insulating layer 130 of the second chip 103 may be bonded to each other. A grinding process of reducing a thickness of the second substrate 106 of the second chip 103 may be performed to expose the separation structure 115 in the second substrate 106, but the example embodiments are not limited thereto.

Referring to FIGS. 11 and 13A to 13C, in operation S20, a conductive layer 210 covering a recess portion 106*r* formed on the second chip 103 and/or a conductive pad 215 contacting the conductive layer 210, etc., may be formed, but the example embodiments are not limited thereto.

A horizontal insulating layer 140 may be conformally deposited on the second surface 106*s*2 of the second substrate 106 having a reduced thickness. The horizontal insulating layer 140 may be formed to have a multilayer structure by performing deposition processes two or more times, but is not limited thereto.

In the third region R3 (see, e.g., FIG. 1), a portion of the second substrate 106 may be removed along the second surface 106*s*2 of the second substrate 106 while penetrating through the horizontal insulating layer 140, thereby forming a recess portion 106*r*. In at least one example embodiment, an etching process of removing the horizontal insulating layer 140 and an etching process of removing the second substrate 106 may be the same process and may be performed at one time (e.g., the removal of the horizontal insulating layer 140 and the removal of the second substrate 106 may occur during the same etching operation, etc.), but the example embodiments are not limited thereto. A sidewall of the recess portion 106*r* and an exposed side surface of the horizontal insulating layer 140 may be coplanar and/or a substantially coplanar with each other, but are not limited thereto.

A first via hole 310*a*, extending inward from the first chip structure 3 through the second chip 103 in the second region R2, and a second via hole 310*b*, extending inward from the first chip structure 3 through the second chip 103 in the third region R3, may be formed. The first via hole 310*a* may expose a first pad 15*p*1 of a first interconnection structure 15 and/or a pad portion 127*p* of a second interconnection structure 127, etc., and the second via hole 310*b* may expose the second pad 15*p*2 of the first interconnection structure 15 and may be spaced apart from the second interconnection structure 127.

The conductive layer 210 may be formed by performing a deposition process to form at least one conductive material layer to cover the horizontal insulating layer 140 and the recess portion 106*r*, and performing a patterning process on the conductive layer 210, etc. The conductive material may be, for example, a metal material such as titanium (Ti), tungsten (W), copper (Cu), aluminum (Al), and/or silver (Ag), etc., and the patterning process may be performed to remove an entirety of the conductive material layer in the first region R1 and/or to separate a portion of the conductive material layer in the second and/or third regions R2 and/or R3, etc. Accordingly, the conductive layer 210 may be formed to cover a portion of an upper surfaces of the horizontal insulating layer 140 in the second region R2 and the third region R3, but the example embodiments are not limited thereto. The conductive layer 210 may conformally cover a sidewall and a bottom surface of the recess portion 106*r* in the third region R3. The conductive layer 210 may be conformally formed within the first and second via holes 310*a* and 310*b*, etc.

Then, a conductive pad 215 may be formed in the recess portion 106*r*. The conductive pad 215 may be formed by filling the recess 106*r* with a conductive material, for example, Al, etc. In at least one example embodiment, the conductive pad 215 may fill a portion of the recess portion 106*r* and may be spaced apart from a side surface of the conductive layer 210. Additionally, the conductive pad 215 may fill the recess portion to contact the side surface of the conductive layer 210. An upper surface of the conductive pad 215 may be formed to be on the same and/or substantially the same level as, or lower than, a level of an upper surface of the horizontal insulating layer 140, but the example embodiments are not limited thereto. The conductive pad 215 formed in the recess portion 106*r* may contact the conductive layer 210.

Referring to FIGS. 11 and 14A to 14C, in operation S30, a first passivation layer 230, covering at least a portion of the conductive layer 210, and a grid pattern 150 may be formed.

A grid pattern 150 may be formed on the horizontal insulating layer 140 in the first region R1. The grid pattern 150 may be formed by performing a deposition process of depositing an insulating material, for example, an oxide or a nitride, etc., a patterning process, or the like. In the deposition process, a first passivation layer 230' may be formed to cover the horizontal insulating layer 140 and the sidewall of the recess 106*r* in the third region R3, but is not limited thereto. Accordingly, the first passivation layer 230' may have the same material as the grid pattern 150 and have the same and/or substantially the same thickness, but is not limited thereto, and for example, may have a different material and/or different thicknesses, etc. In at least one example embodiment, the first passivation layer 230' may extend along a side surface and a bottom surface of the conductive layer 210 in the recess portion 106*r* to cover a side surface and an upper surface of the conductive pad 215, etc. Additionally, the first passivation layer 230' may be formed on only the side surface of the conductive layer 210 in the recess 106*r* using a mask.

Since the first passivation layer 230' includes a material having relatively low step coverage, the first passivation layer 230' may have a groove portion in the recess portion 106*r*, similar to example embodiments described with reference to FIGS. 2 to 5, but the example embodiments are not limited thereto.

Gap-fill insulating layers 340*a* and 340*b*, filling the first and second via holes 310*a* and 310*b*, and buffer insulating layers 345*a* and 345*b*, covering the gap-fill insulating layers 340*a* and 340*b* and having upper surfaces on a level higher than a level of an upper surface of the horizontal insulating layer 140, may be formed. The buffer insulating layers 345*a* and 345*b* may include, for example, a photoresist material, but is not limited thereto, and for example, may include different insulative materials.

Referring to FIGS. 11 and 2 to 4, in operation S40, a plurality of color filters 160, a plurality of microlenses 170, and/or a second passivation layer 240 may be formed, but the example embodiments are not limited thereto.

The color filters 160 may be formed on the horizontal insulating layer 140, and the microlenses 170 may be formed on the color filters 160. In at least one example embodiment, the color filters 160 may cover the grid pattern 150, but the example embodiments are not limited thereto. The color filters 160 may be formed in the first region R1. In a deposition process of forming the color filters 160, the color filters 160 may be formed together with at least one light blocking color filter layer 260 of the second region R2, but the example embodiments are not limited thereto. The microlenses 170 may be formed in the first region R1. In the deposition process of forming the microlenses 170, the upper capping layer 250 of the second region R2 may be formed together, but the example embodiments are not limited thereto.

A deposition process may be performed on the first passivation layer 230 to form the second passivation layer 240 covering an upper surface of the first passivation layer 230 and the first passivation layer 230 in the recess 106*r*, etc.

As the second passivation layer 240 is formed of a material having a step coverage higher than the step coverage of a material of the first passivation layer 230, the second passivation layer 240 may have a groove portion having a size smaller than a size of the first passivation layer 230, and/or may not have a groove portion while covering the trench, but is not limited thereto. Accordingly, the conductive layer 210 may have improved protection and/or be prevented from being damaged due to moisture permeation caused by, e.g., humidification, water exposure, etc., and thus, an image sensor having improved endurance and/or reliability may be provided. In addition, the second passivation layer 240 may be formed together in the deposition process of forming the microlenses 170 (see, e.g., FIGS. 2 to 4), or may be formed together in the deposition process of forming the color filters 160 (see, e.g., FIG. 7A), or may be formed together in a deposition process of forming the buffer insulating layer 345b, etc., but is not limited thereto. That is, the second passivation layer 240 may be formed without adding a process, so that an image sensor having improved productivity and/or reduced manufacturing time and/or reduced manufacturing costs may be provided. According to some example embodiments, the second passivation layer 240 may be formed through an additional process (see, e.g., FIG. 8).

As described above, a second passivation layer having improved step coverage may be additionally formed with a first passivation layer covering a conductive layer in a recess portion, and thus, an image sensor having improved performance, image quality, productivity and/or reliability may be provided.

While various example embodiments have been shown and described above, it will be apparent to those of ordinary skill in the art that modifications and/or variations could be made to the example embodiments without departing from the scope of the inventive concepts as defined by the appended claims.

What is claimed is:

1. An image sensor comprising:
   a chip structure including a first region and a second region,
   the chip structure further comprising,
   a substrate having a first surface, a second surface, and a recess portion, the second surface opposite the first surface, and the recess portion recessed from the second surface in the second region;
   a plurality of photoelectric conversion devices included in the substrate in the first region;
   at least one horizontal insulating layer on the second surface of the substrate;
   a plurality of color filters on the at least one horizontal insulating layer in the first region;
   a grid pattern between the plurality of color filters on the at least one horizontal insulating layer;
   a plurality of microlenses on the plurality of color filters;
   at least one conductive layer on a sidewall and a bottom surface of the recess portion and on the at least one horizontal insulating layer in the second region;
   at least one conductive pad in contact with the at least one conductive layer in the recess portion;
   a first passivation layer on a side surface of the at least one conductive layer in the recess portion and the at least one conductive layer on the at least one horizontal insulating layer; and
   a second passivation layer on side surface of the first passivation layer in the recess portion.

2. The image sensor of claim 1, wherein
the second passivation layer has at least one protrusion extended toward the first passivation layer from the side surface of the first passivation layer in the recess portion.

3. The image sensor of claim 2, wherein
the at least one protrusion has a convex shape and faces toward the side surface of the first passivation layer.

4. The image sensor of claim 2, wherein
the at least one protrusion is in contact with the at least one conductive layer.

5. The image sensor of claim 1, wherein the first passivation layer includes:
   a first portion on a side surface of the at least one conductive layer, a second portion extended from the first portion to be on a bottom surface of the at least one conductive layer, and a third portion extended from the second portion to be on a side surface of the at least one conductive pad.

6. The image sensor of claim 5, wherein
the second passivation layer is on the first to third portions, and the second passivation layer is separated from the at least one conductive layer in the recess portion by the first passivation layer.

7. The image sensor of claim 5, wherein
an upper end of the third portion is on a level higher than a level of an upper surface of the at least one conductive pad.

8. The image sensor of claim 5, wherein
the first passivation layer further includes a fourth portion extended from the third portion and is on at least a portion of an upper surface of the at least one conductive pad, and
the second passivation layer is on an upper surface of the fourth portion.

9. The image sensor of claim 1, wherein
the first passivation layer includes a same material as the grid pattern.

10. The image sensor of claim 1,
wherein the chip structure further comprises:
   a first chip structure; and
   a second chip structure on the first chip structure,
wherein the first chip structure comprises:
   a first substrate; and
   a first interconnection structure on the first substrate,
wherein the second chip structure comprises the substrate, the plurality of photoelectric conversion devices, the at least one horizontal insulating layer, the plurality of color filters, the grid pattern, the at least one conductive layer, the at least one conductive pad, the first passivation layer, and the second passivation layer,
wherein the second chip structure further comprises a second interconnection structure between the first chip structure and the substrate,
wherein the chip structure further comprises a via hole penetrating through the substrate and exposing a pad of the first interconnection structure, and
wherein the at least one conductive layer further comprises a portion on a side surface and a bottom surface of the via hole and contacting the pad of the first interconnection structure.

11. The image sensor of claim 1, wherein
the second passivation layer includes a same material as the plurality of microlenses.

12. The image sensor of claim 1, wherein
a thickness of the second passivation layer is higher than a thickness of the first passivation layer.

13. The image sensor of claim 1, wherein the chip structure further includes a third region between the first region and the second region, the chip structure further includes a light blocking pattern, the light blocking pattern on the at least one horizontal insulating layer in the third region, and an upper capping layer on the light blocking pattern, and an upper surface of the second passivation layer is on a same level as an upper surface of the upper capping layer.

14. The image sensor of claim 1, wherein the chip structure further includes a third region between the first region and the second region, the chip structure further includes a light blocking pattern, the light blocking pattern on the at least one horizontal insulating layer in the third region, and an upper capping layer on the light blocking pattern, and an upper surface of the second passivation layer is on a same level as an upper surface of the light blocking pattern.

15. An image sensor comprising:

a semiconductor substrate having a first surface, a second surface, and a recess portion, the second surface opposite the first surface, and the recess portion extending inward towards the semiconductor substrate from the second surface;

a plurality of photoelectric conversion devices included in the semiconductor substrate;

a conductive layer on the second surface of the semiconductor substrate;

a conductive pad in contact with the conductive layer in the recess portion;

a first passivation layer on a portion of the second surface of the semiconductor substrate, a side surface of the recess portion, a portion of a bottom surface of the recess portion, and a side surface of the conductive pad; and a second passivation layer on an upper surface of the first passivation layer and at least a portion of the first passivation layer in the recess portion, wherein the conductive layer extends between the first passivation layer and the second surface of the semiconductor substrate, between the first passivation layer and a side surface of the recess portion, between the first passivation layer and a portion of the bottom surface of the recess portion, and between a lower surface of the conductive pad and a portion of the bottom surface of the recess portion.

16. The image sensor of claim 15, wherein the second passivation layer is separated from the conductive layer in the recess portion by the first passivation layer.

17. The image sensor of claim 15, wherein the second passivation layer includes a protrusion directed toward the first passivation layer, and the protrusion is on a level lower than a level of an uppermost portion of the first passivation layer.

18. An image sensor comprising:

a chip structure, the chip structure including a first region and a second region, wherein the chip structure further comprises, an upper substrate having a first surface, a second surface, and a recess portion, the second surface opposite the first surface, and the recess portion recessed from the second surface in the second region;

a plurality of photoelectric conversion devices included in the upper substrate in the first region;

a horizontal insulating layer on the second surface of the upper substrate;

a conductive layer on a side surface and a bottom surface of the recess portion and at least a portion of the horizontal insulating layer in the second region;

at least one conductive pad in contact with the conductive layer in the recess portion;

a first passivation layer on a side surface of the conductive layer in the recess portion and the conductive layer on the horizontal insulating layer; and a second passivation layer on a side surface of the first passivation layer in the recess portion, and the second passivation layer includes a first protrusion extended toward the first passivation layer from the side surface of the first passivation layer, the second passivation layer including a material having a step coverage higher than a step coverage of a material of the first passivation layer.

19. The image sensor of claim 18, wherein the conductive layer has an end portion which is configured to expose a portion of the horizontal insulating layer in the second region, and the first passivation layer is on the end portion and the exposed portion of the horizontal insulating layer.

20. The image sensor of claim 19, wherein the second passivation layer includes a second protrusion extended toward the first passivation layer toward the end portion.

* * * * *